US008557619B2

(12) United States Patent
Lee et al.

(10) Patent No.: US 8,557,619 B2
(45) Date of Patent: Oct. 15, 2013

(54) LIGHT EMITTING DIODE DISPLAY AND METHOD OF MANUFACTURING THE SAME

(75) Inventors: Keon Jae Lee, Daejeon (KR); Sang Yong Lee, Gwangju (KR); Seung Jun Kim, Daejeon (KR)

(73) Assignee: Siltron Inc., Gyeongbuk (KR)

( * ) Notice: Subject to any disclaimer, the term of this patent is extended or adjusted under 35 U.S.C. 154(b) by 314 days.

(21) Appl. No.: 12/852,463

(22) Filed: Aug. 7, 2010

(65) Prior Publication Data
US 2011/0057211 A1 Mar. 10, 2011

(30) Foreign Application Priority Data

Aug. 7, 2009 (KR) .................. 10-2009-0072832

(51) Int. Cl.
*H01L 21/00* (2006.01)
(52) U.S. Cl.
USPC .................. 438/33; 438/28; 438/34; 438/35; 257/89
(58) Field of Classification Search
USPC .............................. 257/89, E33.067; 438/33
See application file for complete search history.

(56) References Cited

U.S. PATENT DOCUMENTS

| | | | |
|---|---|---|---|
| 7,622,367 B1 | 11/2009 | Nuzzo | |
| 7,662,545 B2 | 2/2010 | Nuzzo | |
| 2005/0042784 A1* | 2/2005 | Yanagisawa et al. | 438/28 |
| 2007/0032089 A1* | 2/2007 | Nuzzo et al. | 438/725 |
| 2008/0002412 A1* | 1/2008 | Tanaka et al. | 362/307 |
| 2008/0157235 A1 | 7/2008 | Rogers | |
| 2008/0170176 A1* | 7/2008 | Shen | 349/64 |
| 2009/0199960 A1 | 8/2009 | Nuzzo | |

FOREIGN PATENT DOCUMENTS

| | | |
|---|---|---|
| JP | 2007027693 | 2/2007 |
| JP | 2008502151 | 1/2008 |
| JP | 2009508322 | 2/2009 |
| KR | 1020050052480 A | 6/2005 |
| KR | 1020060125620 A1 | 12/2006 |
| KR | 1020070037484 A | 4/2007 |
| KR | 1020080015921 A | 2/2008 |
| KR | 1020090086199 A | 8/2009 |
| WO | 2009057194 A1 | 5/2009 |
| WO | 2009123306 A1 | 10/2009 |

OTHER PUBLICATIONS

A Printable Form of Single-Crystalline Gallium Nitride for Flexible Optoelectronic Systems, K. Lee, J. Lee, H. Hwang, Z. Zachery, R. F. Davis, J.A. Rogers, R. G. Nuzzo, Small, 1, 1164, 2005 Wiley-VCH Verlag GmbH & Co.*

(Continued)

*Primary Examiner* — Andy Huynh
*Assistant Examiner* — Sitaramarao S Yechuri
(74) *Attorney, Agent, or Firm* — Lewis Roca Rothgerber LLP

(57) ABSTRACT

A method of manufacturing LED display is provided. The method provides a sacrificial substrate on which RGB LED device layers are formed, respectively. The method etches and patterns the LED device layer to manufacture RGB LED devices, respectively. The method removes the sacrificial substrate in a lower side of the LED device. The method contacts a stamping processor to the RGB LED devices to separate the RGB LED devices from the sacrificial substrate. The method transfers the LED device, which is attached to the stamping processor, to a receiving substrate.

15 Claims, 42 Drawing Sheets

(56) References Cited

OTHER PUBLICATIONS

"Bendable and Transparent Barium Titanate Capacitors on Plastic Substrates for High Performance Flexible Ferroelectric Devices." K. Park, S. Lee, S. Kim, J. Jang, S. Kang, K. Lee, Electrochem. Solid-State Lett. 13(7), G57, 2010.

"Fabrication of Microstructured Silicon (μs-Si) from a Bulk Si Wafer and its Use in the Printing of High-Performance Thin-Film Transistors on Plastic Substrates." K. Lee, H. Ahn, M. Motala, R. G. Nuzzo, E. Menard, J. A. Rogers J. Micromech. Microeng. 20(7), 075018, 2010.

"Complementary Logic Gates and Ring Oscillators on Plastic Substrates by Use of Printed Ribbons of Single-Crystalline Silicon" D. Kim, J. Ahn, H. Kim K. Lee, T. Kim, C. Yu, R. Nuzzo, J. Rogers, IEEE Electron Device Letters 29, 73, 2008.

"Bendable Integrated Circuits on Plastic Substrates by Use of Printed Ribbons of Single-Crystalline Silicon." J. Ahn, H. Kim, E. Menard, K. Lee, D. Kim, Z. Zhu, R. Nuzzo, J. Rogers, Cover feature article, Appl. Phys. Lett. 90, 213501, 2007.

"Heterogeneous Three-Dimensional Electronics by Use of Printed Semiconductor Nanomaterials." J. Ahn, H. Kim, K. Lee, S. Jeon, S. Kang, Y. Sun, R. G. Nuzzo, J. A. Rogers, Science, 314, 1754, 2006.

"High Speed Mechanically Flexible Single-Crystal Silicon Thin-Film Transistors on Plastic Substrates." J. Ahn, H. Kim, K. Lee, Z. Zhu, E. Menard, R. Nuzzo, J. Rogers, IEEE Electron Device Letters, 27, 460, 2006.

"Bendable GaN High Electron Mobility Transistors (HEMTs) on Plastic Substrates" K. Lee, M, Meitl, V. Kumar, I. Adesida, J. Rogers, R. Nuzzo, Journal of Applied Physics, 100, 084907 (2006).

"Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors" H. Ahn, K. Lee, W. Childs, A. Shim, J. A. Rogers, R. G. Nuzzo Journal of Applied Physics, 100, 084907 (2006).

"Additive Soft-Lithographic of Patterning of Submicrometer- and Nanometer-Scale Large-Area Resists on Electronic Materials" H. Ahn, K. Lee, A. Shim, J. A. Rogers, R. G. Nuzzo, Nano Letters, 5, 2533, 2005.

"Transfer Printing by Kinetic Control of Adhesion to an Elastomeric Stamp" M. Meitl, Z. Zhu, V. Kumar, K. Lee, X. Feng, Y. Huang, R. Nuzzo, J. Rogers, cover feature article, Nature Materials, 5, 33, 2006.

"A Printable Form of Single-Crystalline Gallium Nitride for Flexible Optoelectronic Systems" K. Lee, J. Lee, H. Hwang, Z. Zachery, R. F. Davis, J. A. Rogers, R. G. Nuzzo, Small, 1, 1164, 2005.

"Large Area, Selective Transfer of Microstructured Silicon (μe' s-Si) : A Printing-based Approach to High Performance Thin Film Transistors Supported on Flexible Substrates" K. Lee, M. Motala, M. Meitl, W. Childs, E. Menard, A. Shim, J. A. Rogers, R. G. Nuzzo, Advanced Materials, 17, 2336, 2005.

"Masterless Soft-Lithography: Patterning UV/ozone-induced adhesion on poly(dimethylsiloxane) surfaces" W. R . Childs, M .J. Motala, K. Lee, R. G. Nuzzo, Langmuir, 21, 10096, (2005).

"Fabrication of Stable Metallic Patterns Embedded in Poly(dimethylsiloxane) and Model Applications in Non-Planar Electronic and Lab-on-a-chip Device Patterning" K. Lee, K .A. Fosser, R. G. Nuzzo, Cover feature article, Advanced Functional Materials, 15, 557 (2005).

"A Printable Form of Silicon for High Performance Thin Film Transistors on Plastic Substrates" E. Menard, K. Lee, D. Y Khang, R. G. Nuzzo, J. A.. Rogers, Cover feature article, Appl. Phys. Lett. 84, 5398 (2004).

"Printing Nitride Nanostructures" Compound Semiconductor, Feb. 2007.

"Mix n Match Electronic Circuits named one of top advances in Nanotechnology for 2006" MIT's Technology Review Magazine, Dec. 30, 2006.

"3D Chips" Chicago Tribune, Dec. 2006.

"Mix n Match Flexible Circuitry May Brighten Cell Phones" Scientific American, Dec. 2006.

"UI licenses technology for flexible electronics" United Press International, Dec. 2006.

"Process prints silicon on plastic," MIT's Technology Review Magazine, Aug. 2004.

"Making Nanoelectronics for Displays" MIT's Technology Review Magazine, Dec. 19, 2006.

"New Semiconductor Technology Created" United Press International, Dec. 2006.

"Printed Semiconductor Technology won a 2006 Innovation Awards" Wall Street Journal, Sep. 2006.

"Manipulation: Stick and Place" Nature Materials, vol. 5, 9, 2006.

"Printable silicon for ultrahigh performance flexible electronic systems," Innovations Report, Jun. 2004.

"Printable silicon for ultrahigh performance flexible electronic systems," Science daily, Jul. 12, 2004.

"Thinner silicon chips for making flexible thin film transistors," NewKerala.com, Jun. 2004.

"UI research gets flexible," The News-Gazette, Jul. 19, 2004.

"Printable silicon for ultrahigh performance flexible electronics," Space daily Jul. 26, 2004.

"Printable silicon for ultrahigh performance flexible electronic systems," Science blog Jul. 10, 2004.

"Printable silicon for ultrahigh performance flexible electronic systems" Azom.com Jul. 2004.

"Process prints silicon on plastic" The Latest Technology Research News Aug. 2004.

"New TFT process promises multiple benefits" Telecom direct news Jul. 2004.

"Printable silicon advances flexible electronics" R&D magazine, Jul. 2004.

"George Smith Award" for the best paper of 2008 published in IEEE Elect. Dev. Lett. 2009.

Printable silicon for ultrahigh performance flexible electronic systems Eurek Alert Jul. 17, 2004.

"Printable silicon for ultrahigh performance flexible electronic systems" Physorg.com Jul. 2004.

* cited by examiner

FIG.1
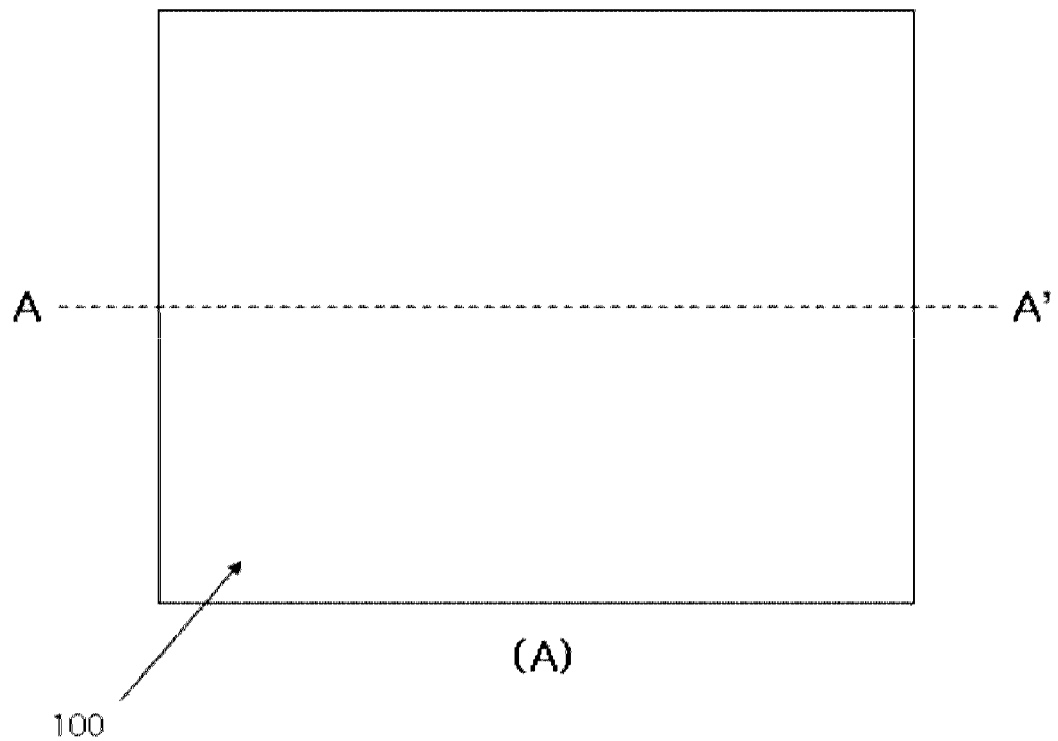
(A)
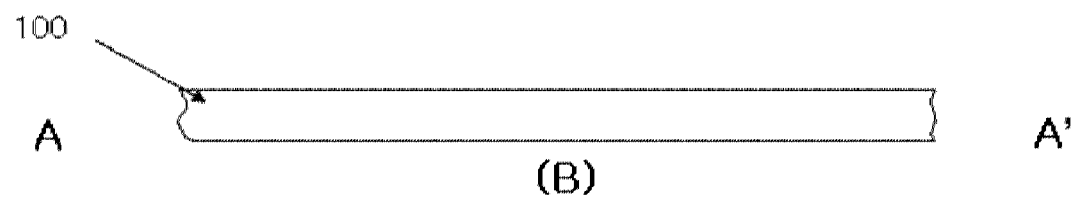
(B)

FIG.4
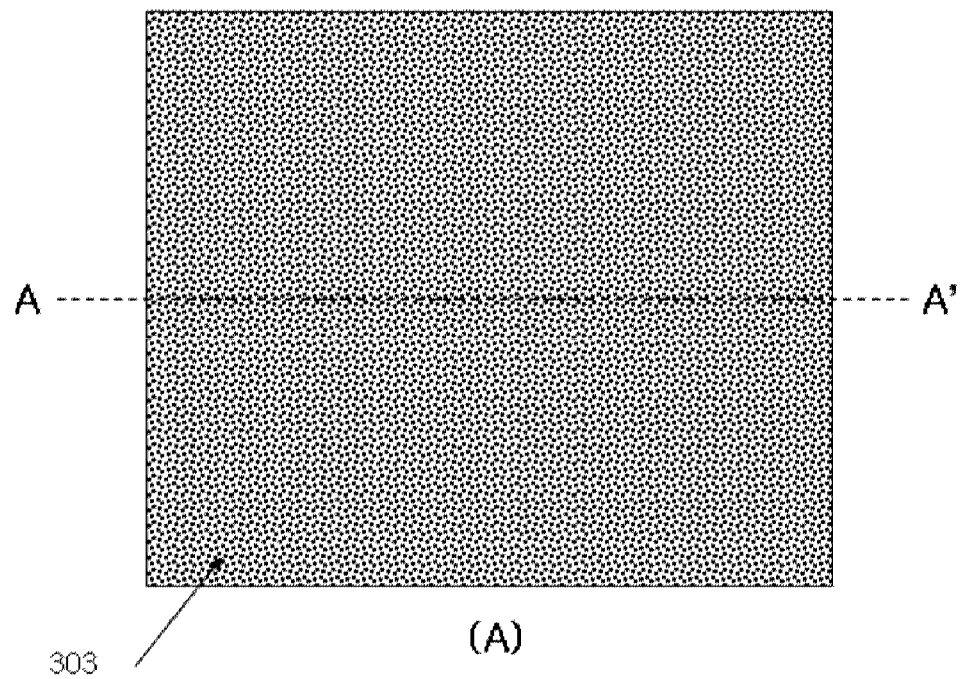
(A)
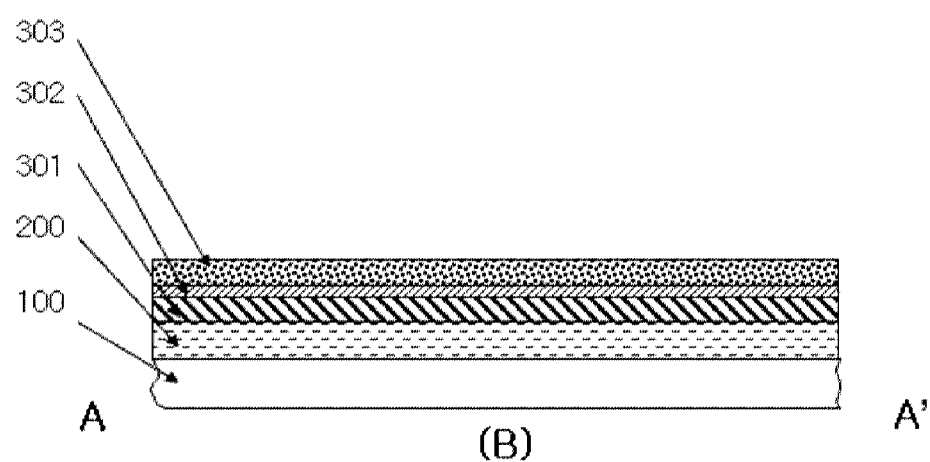
(B)

FIG.5
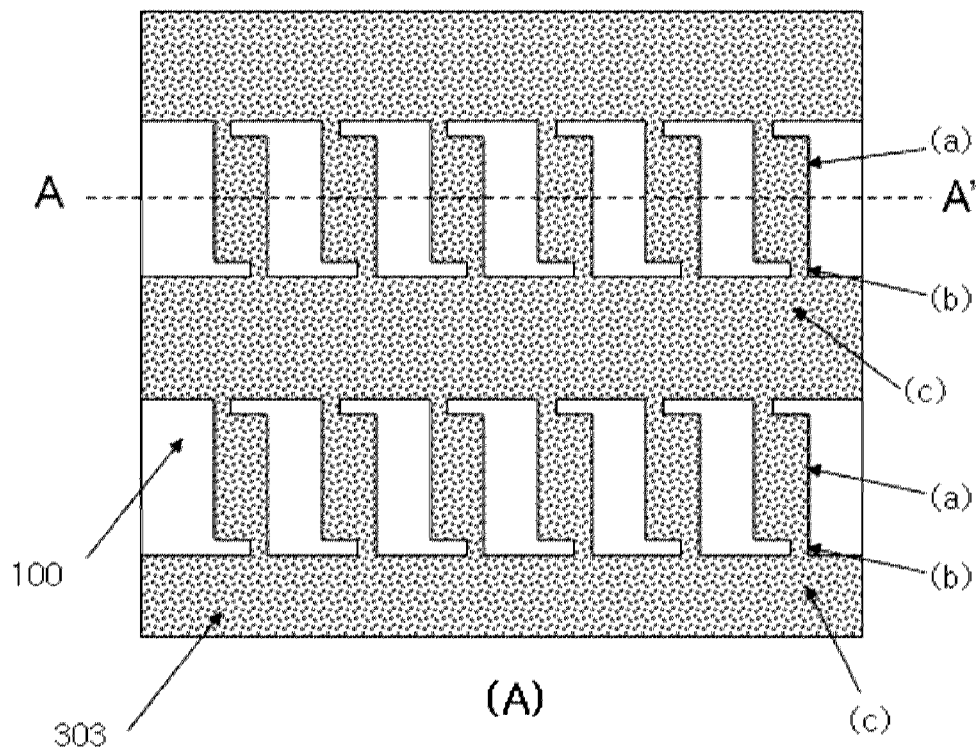
(A)
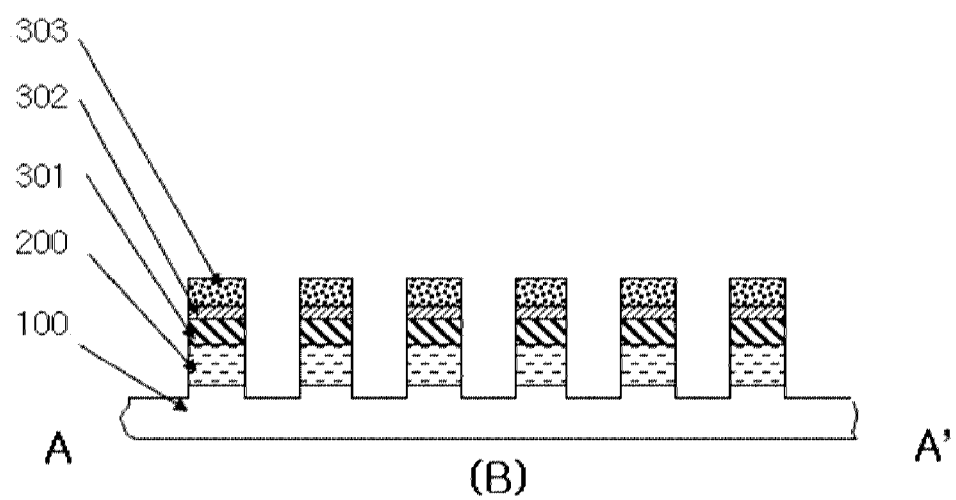
(B)

FIG.6
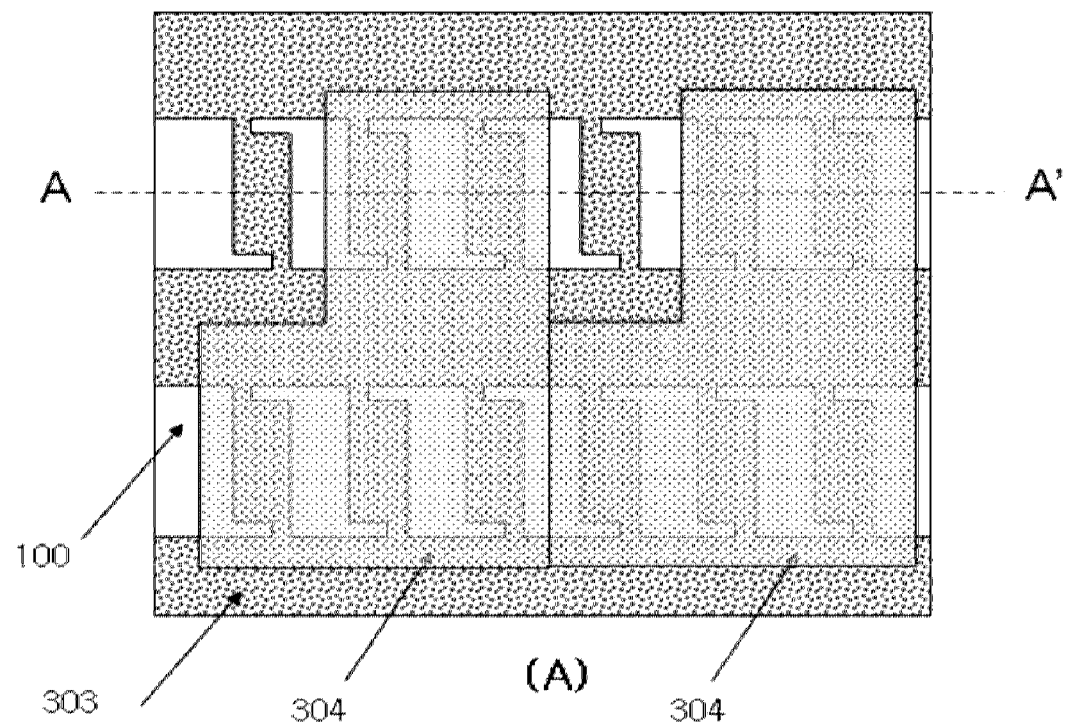
(A)
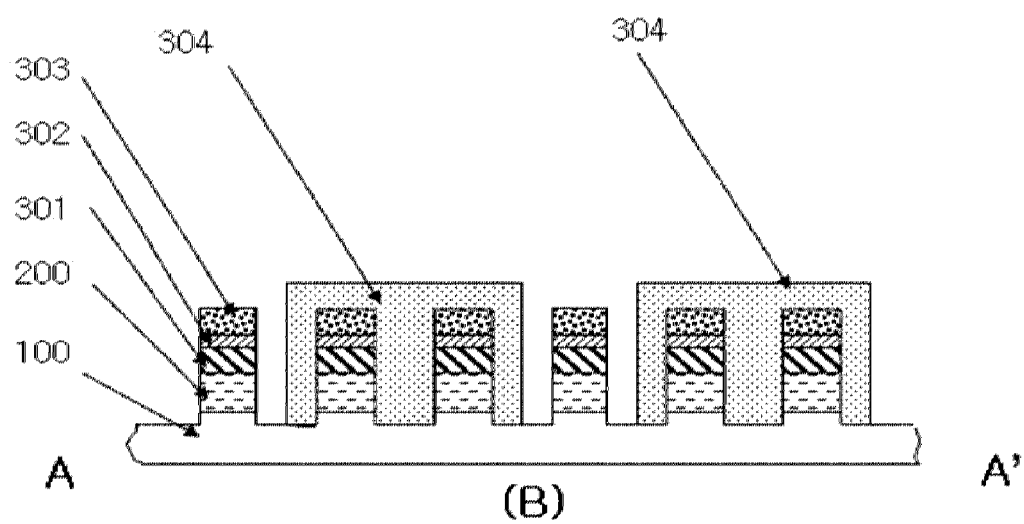
(B)

FIG.7
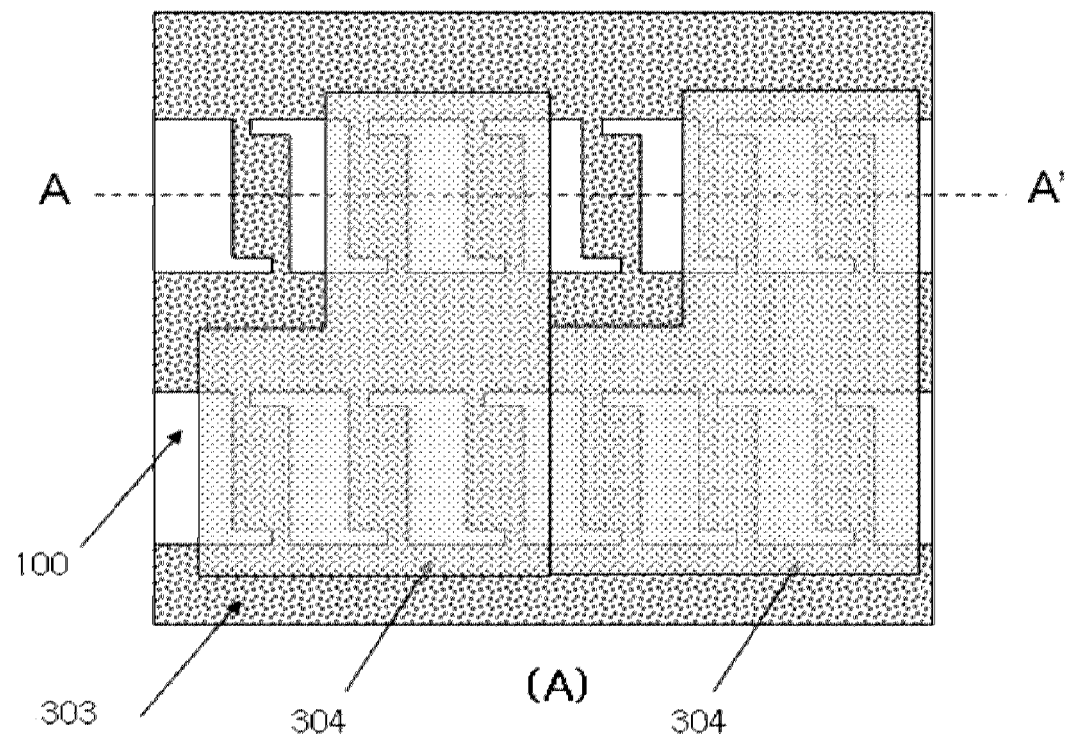
(A)
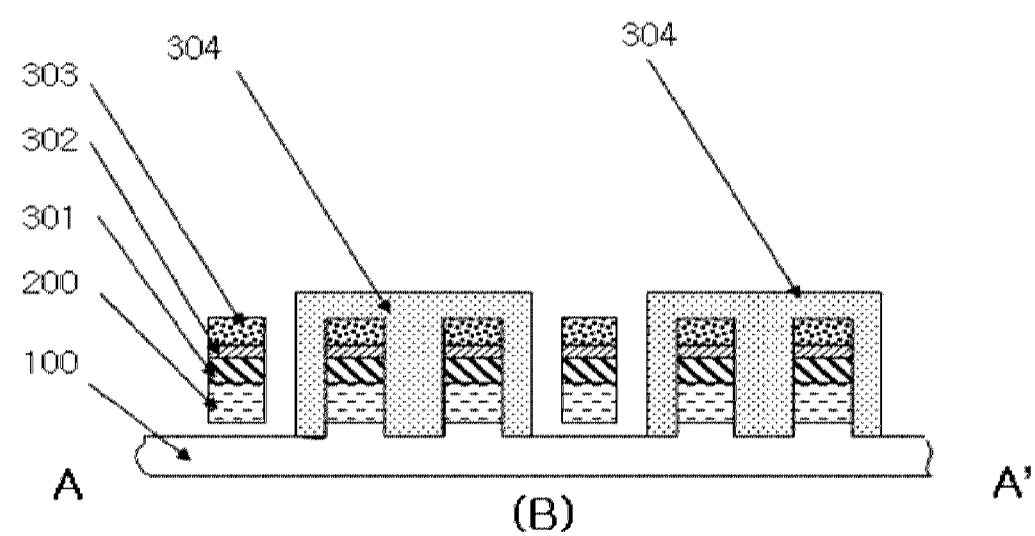
(B)

FIG.9
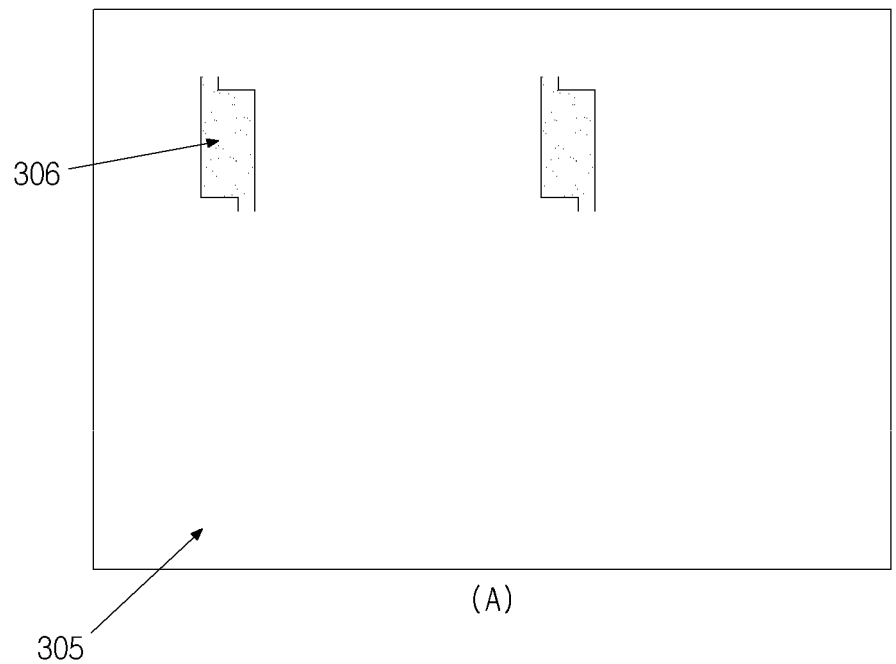
(A)
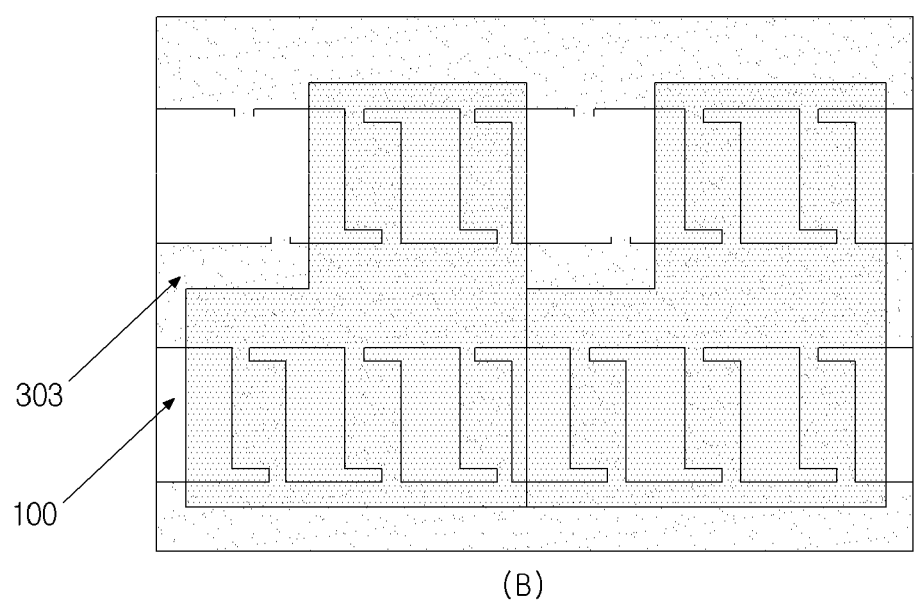
(B)

FIG.10
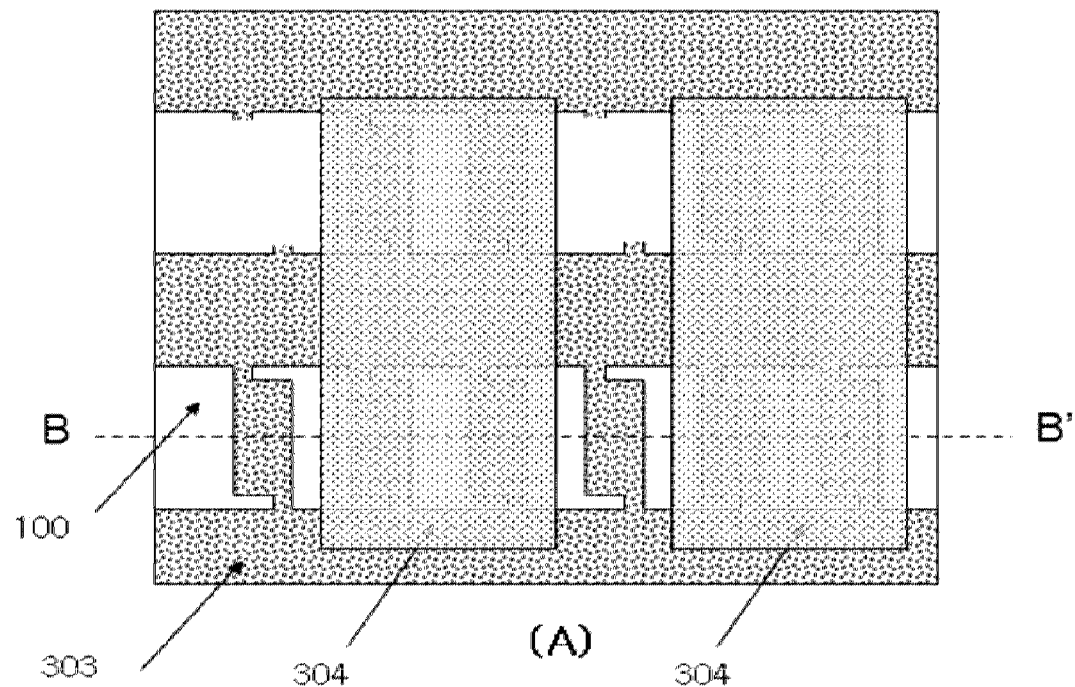
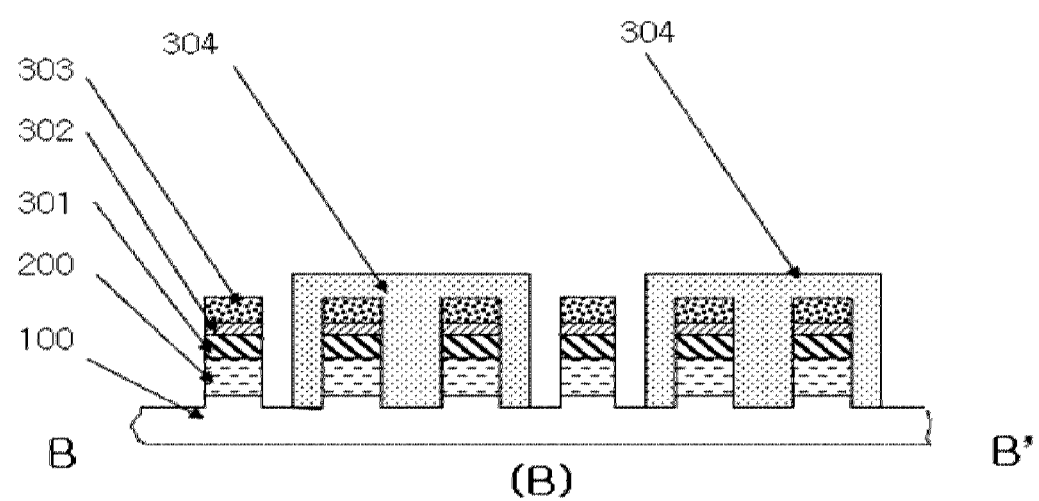

FIG.11
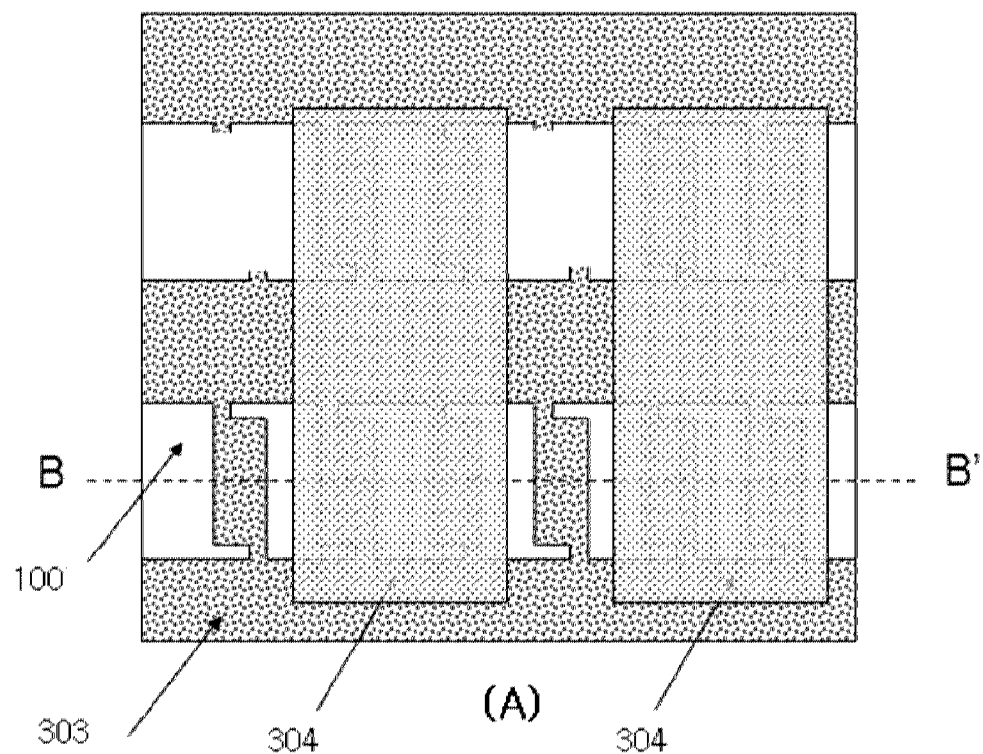
(A)
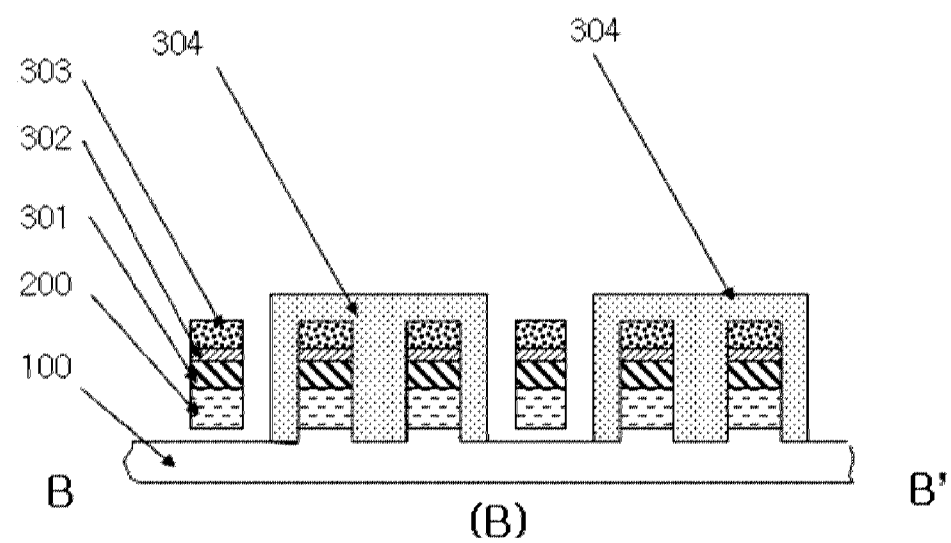
(B)

FIG.13
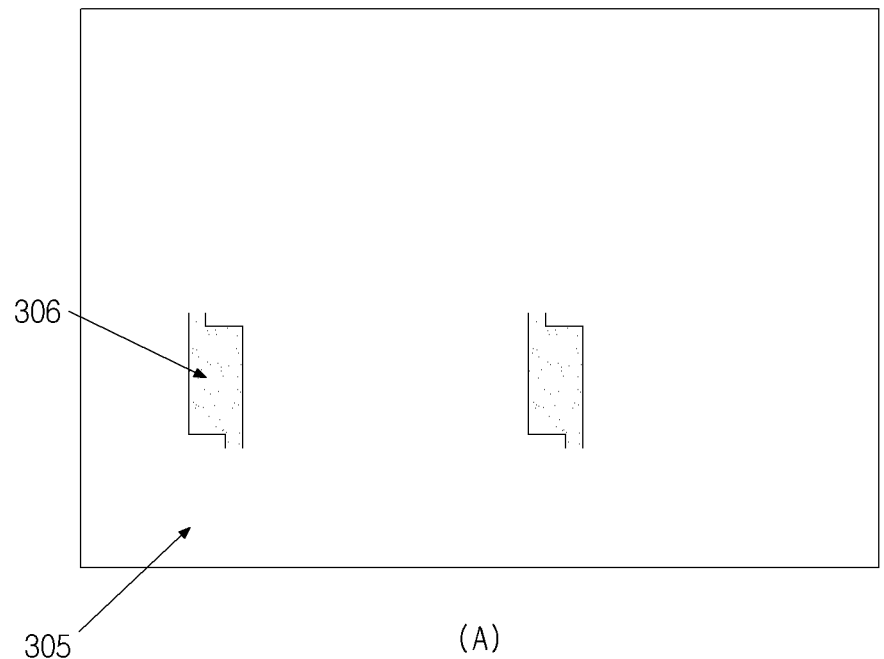
(A)
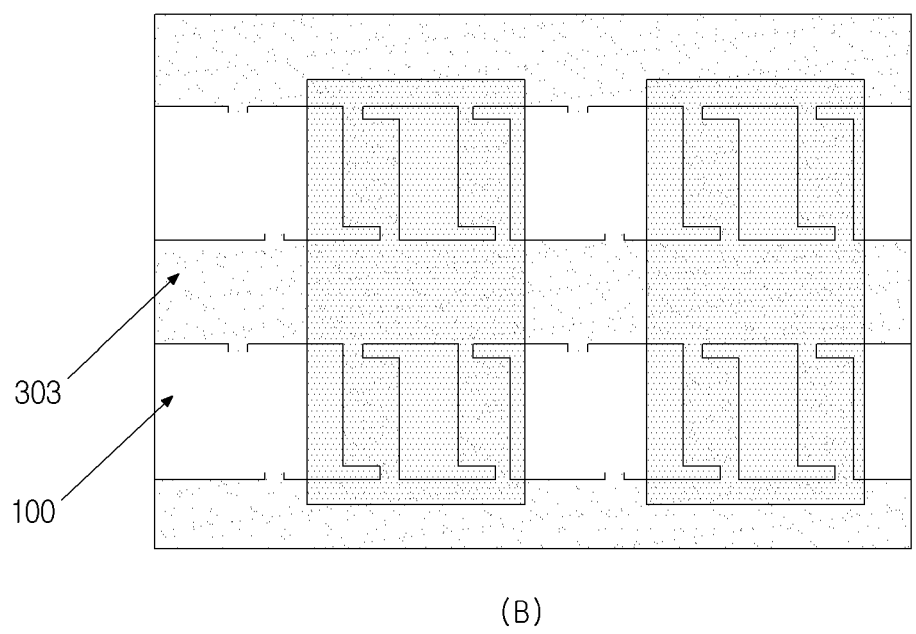
(B)

FIG.14
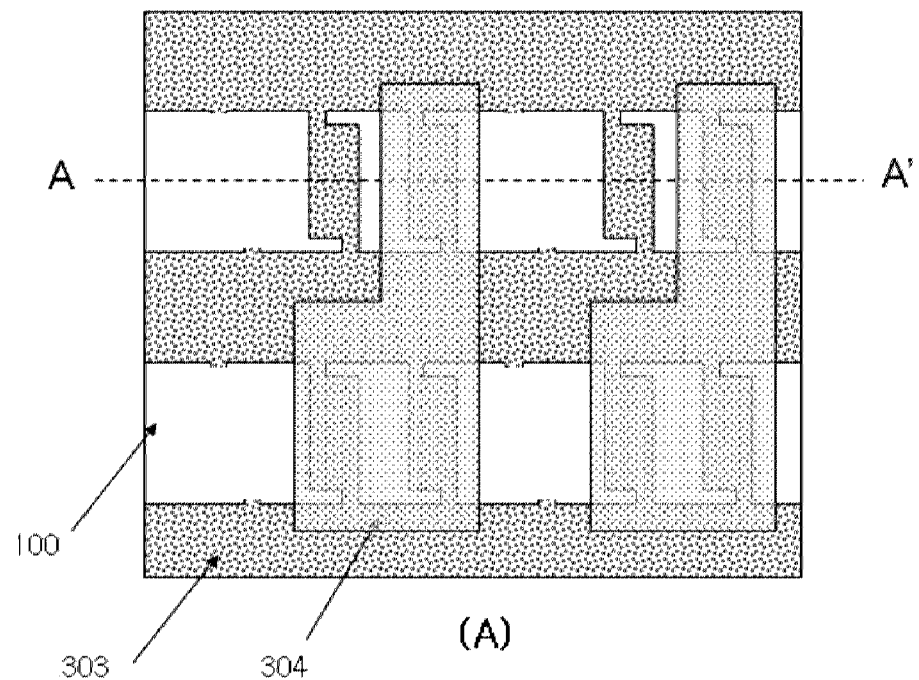
(A)
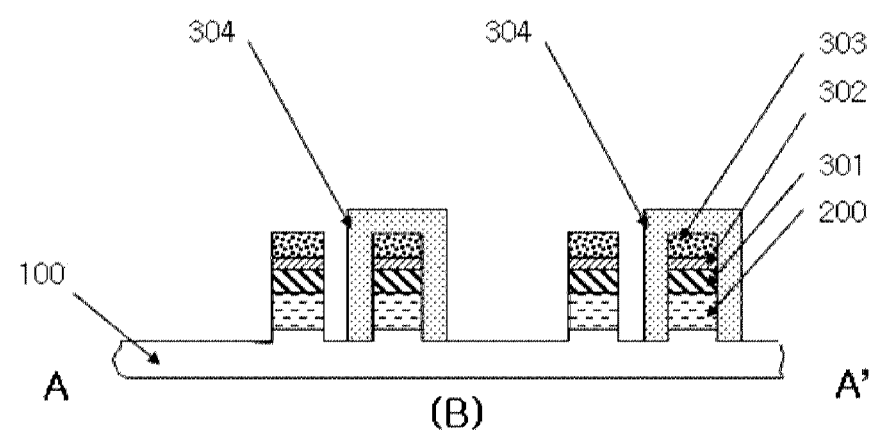
(B)

FIG.15
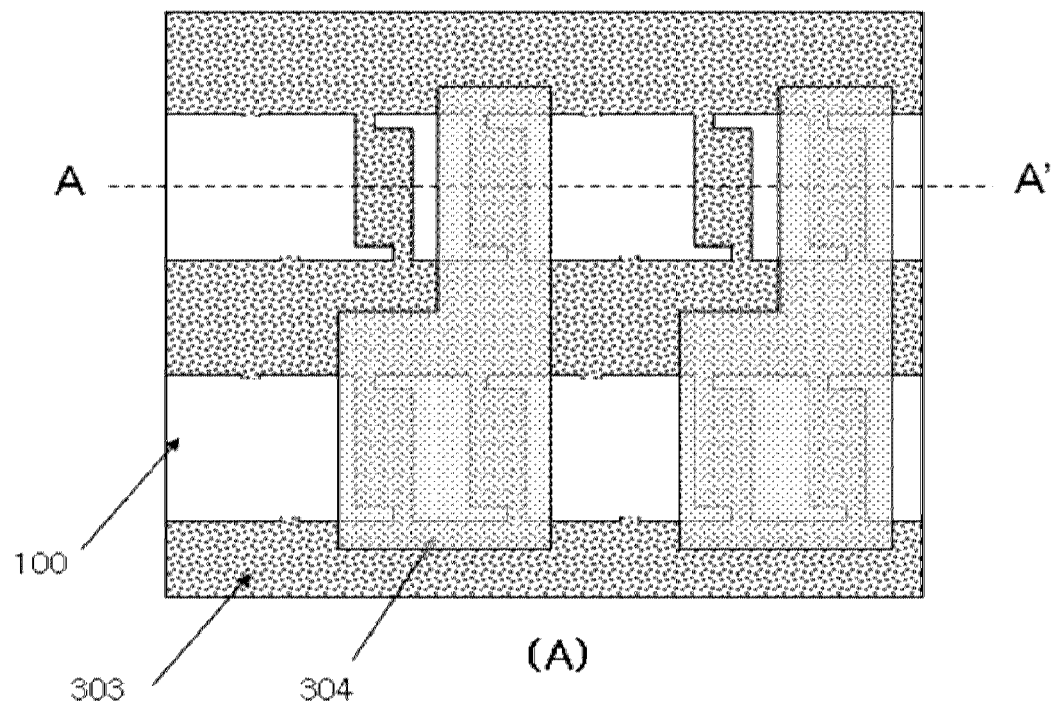
(A)
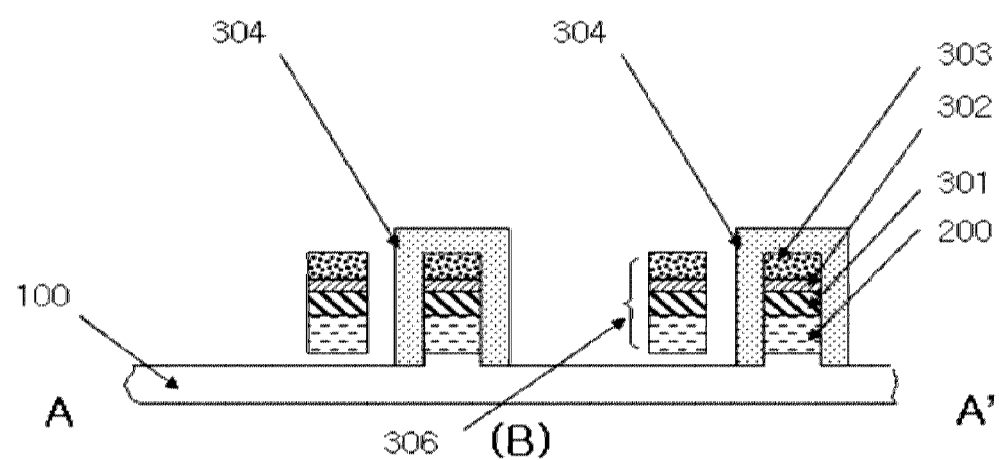
(B)

FIG.16
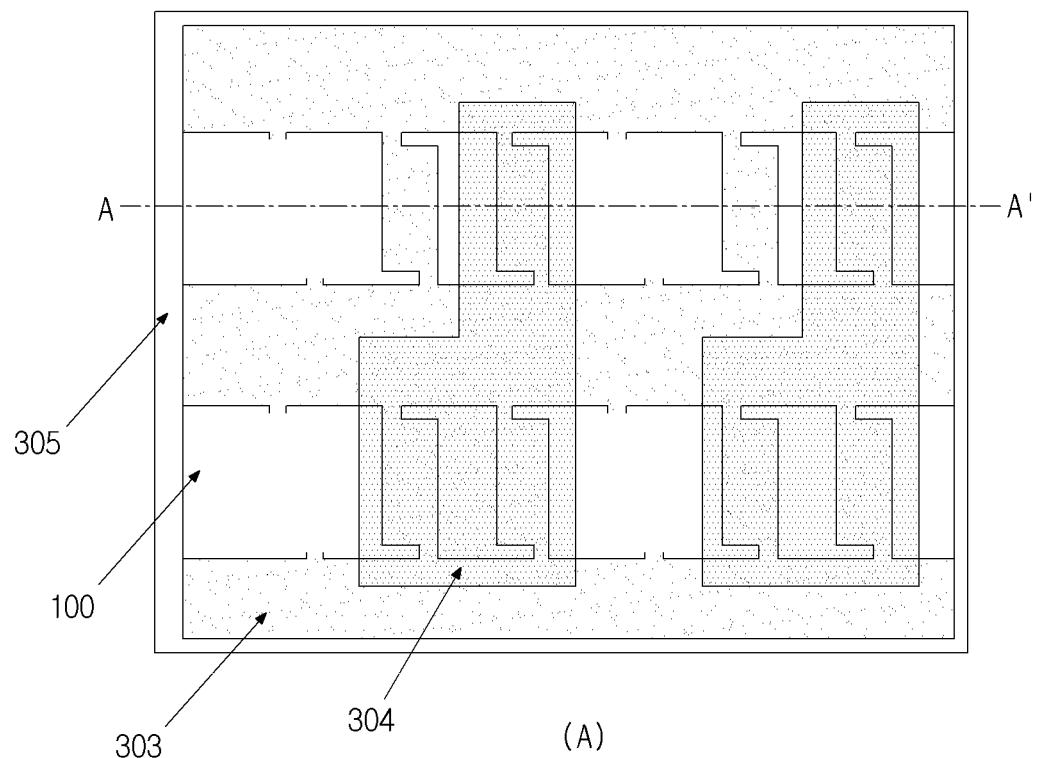
(A)
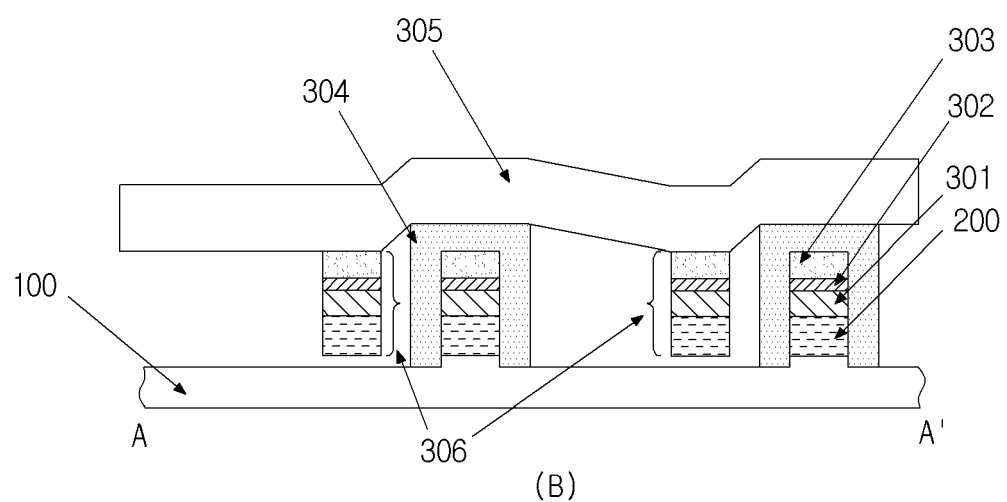
(B)

FIG.17
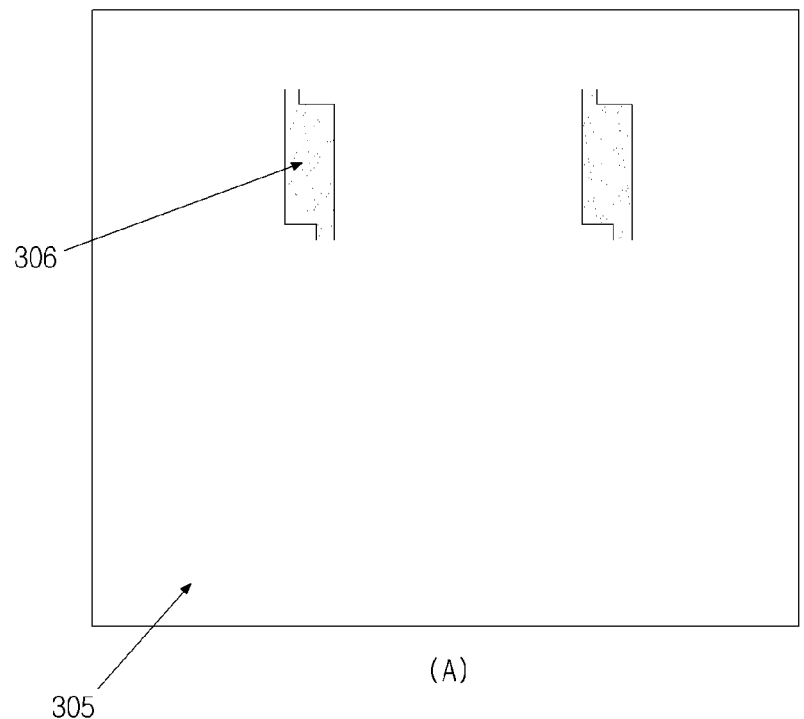
(A)
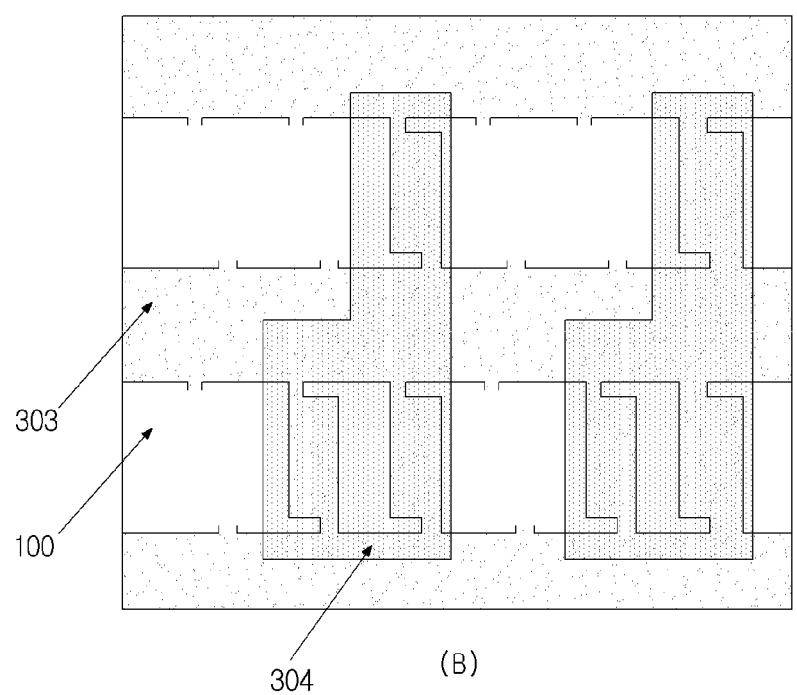
(B)

FIG.18
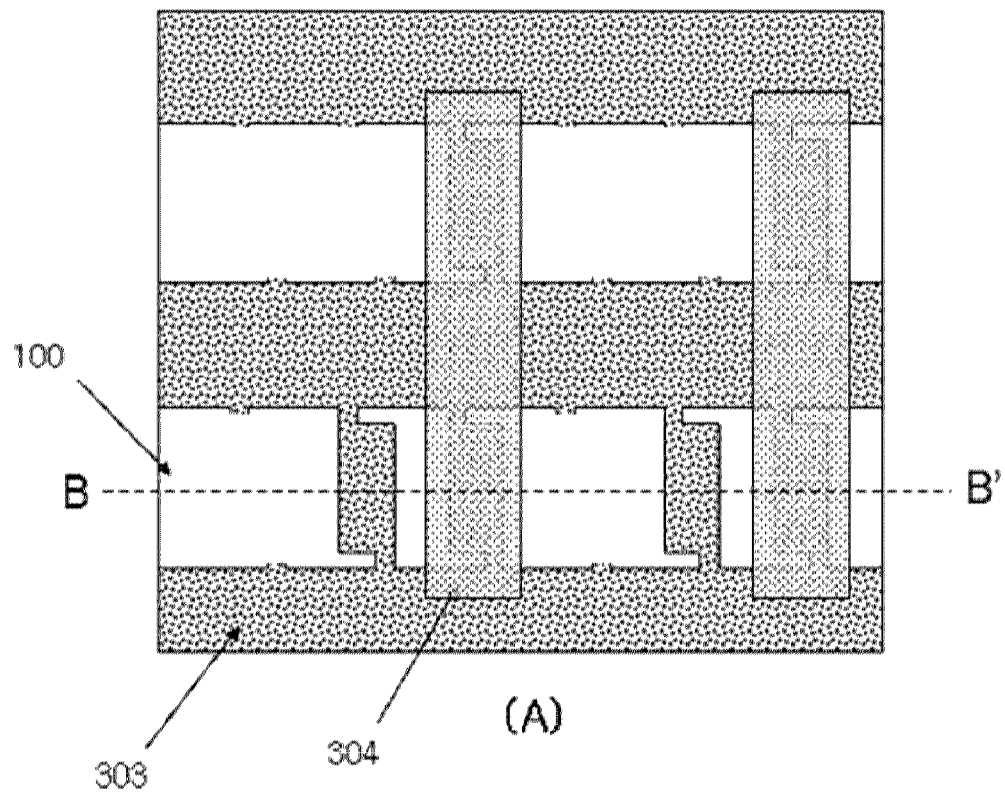
(A)
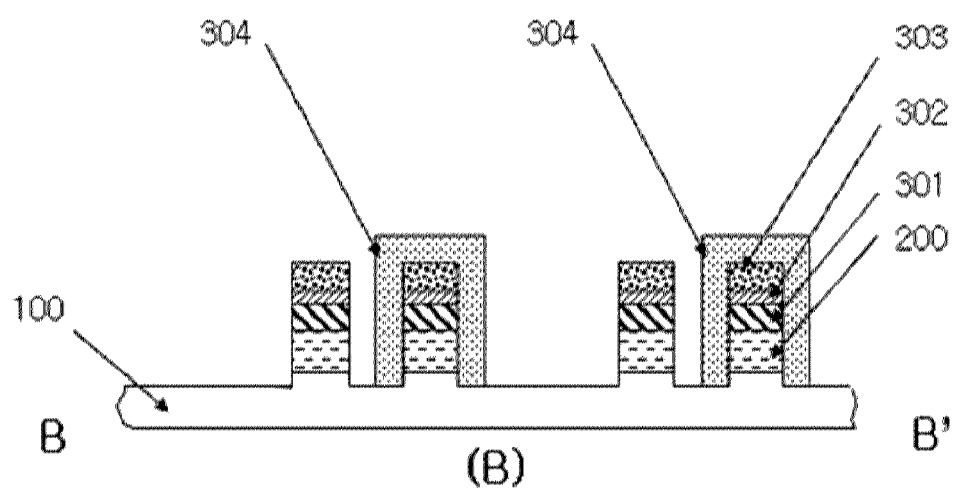
(B)

FIG.19
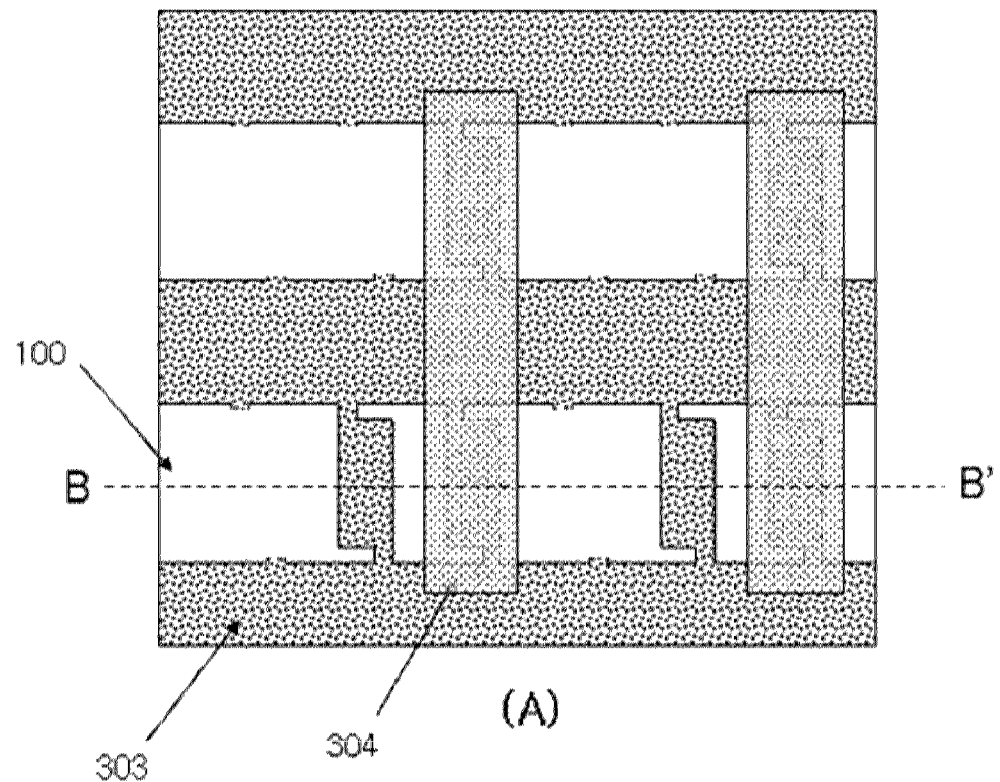
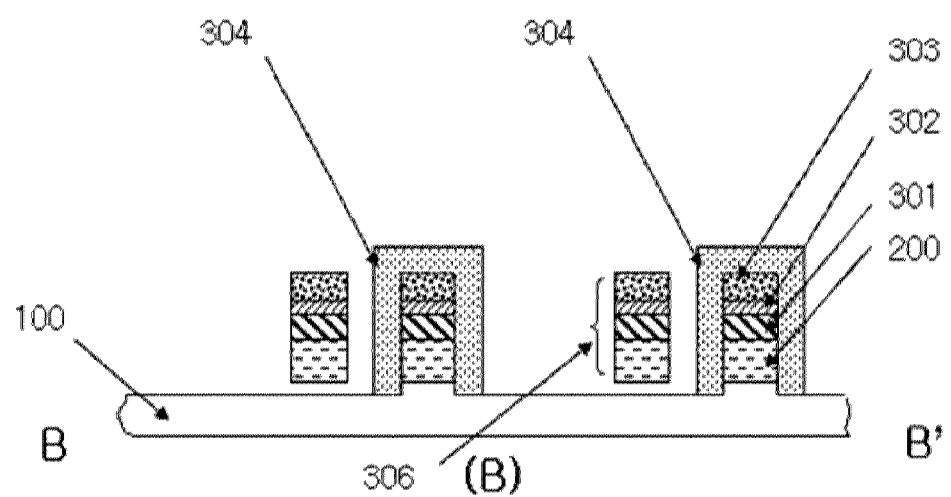

FIG.20
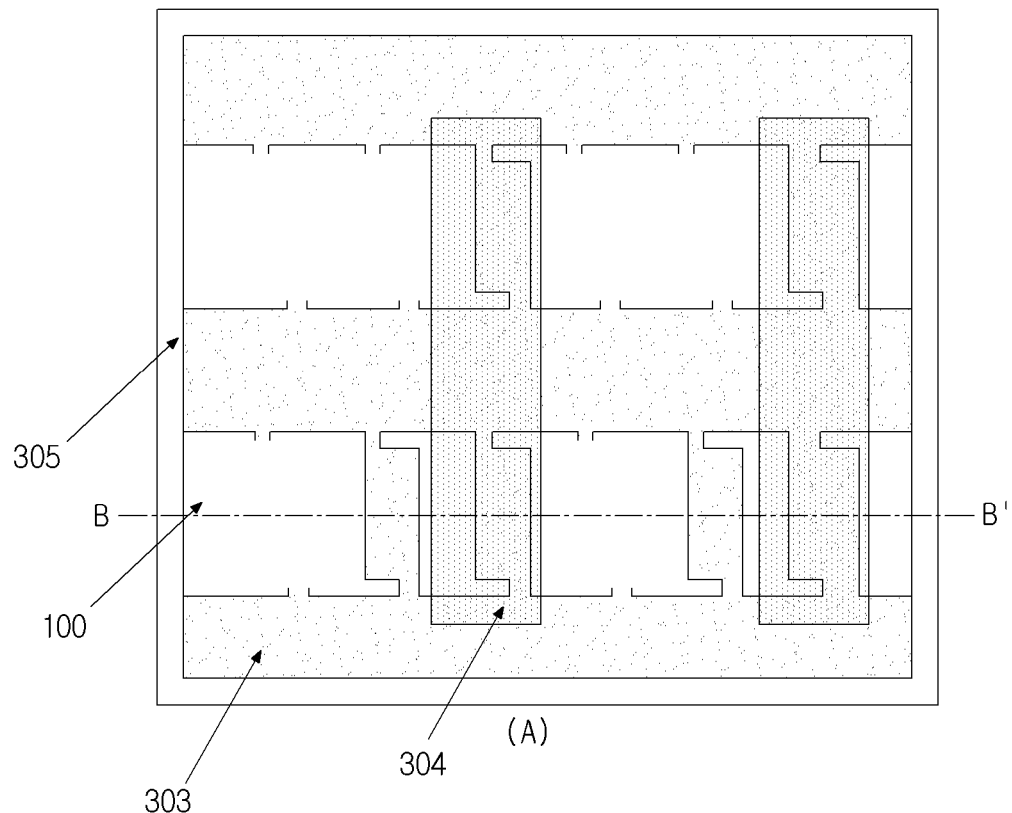
(A)
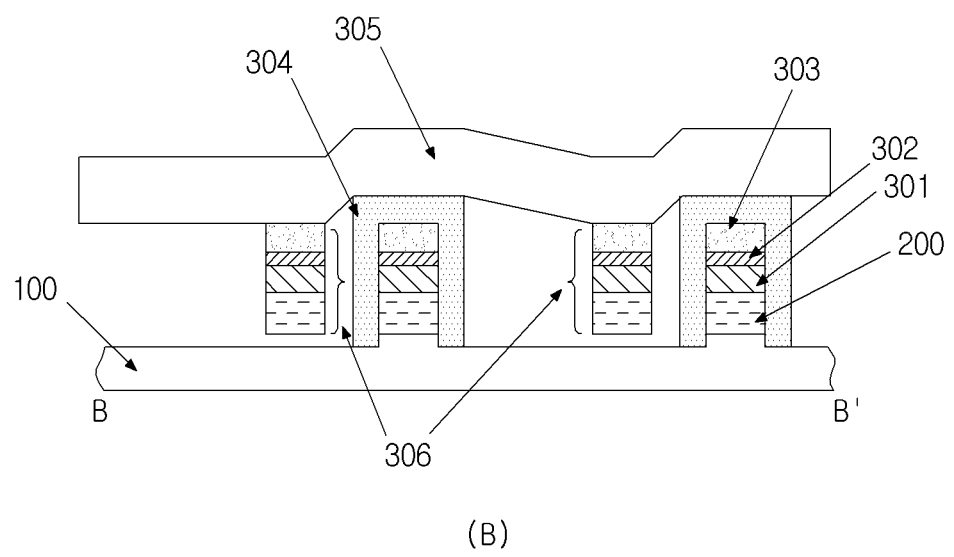
(B)

FIG.21
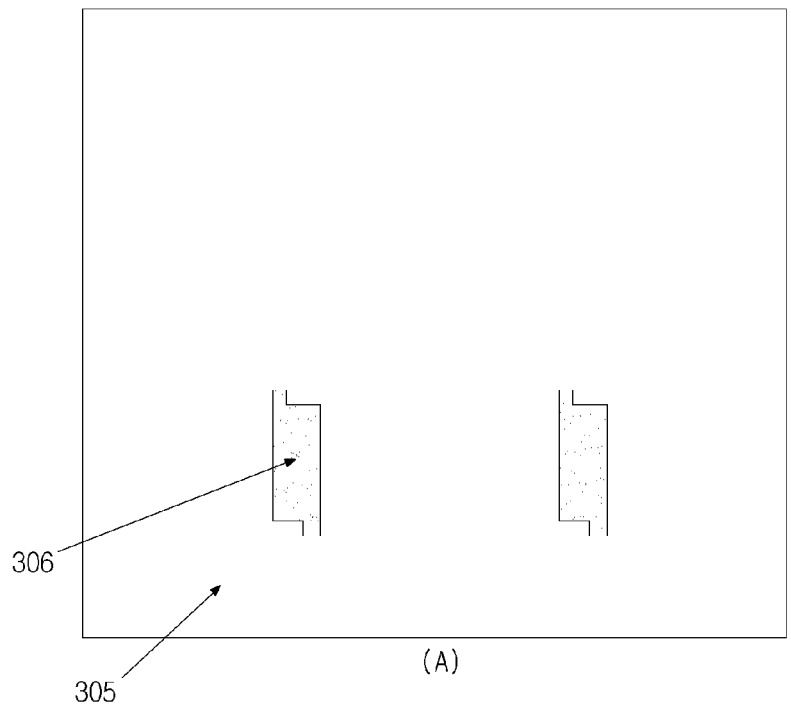
(A)
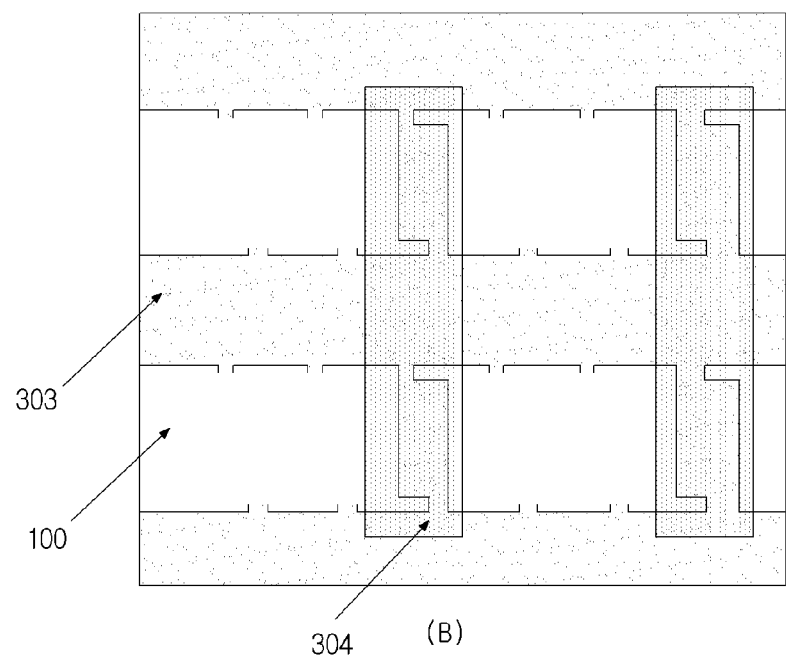
(B)

FIG.22
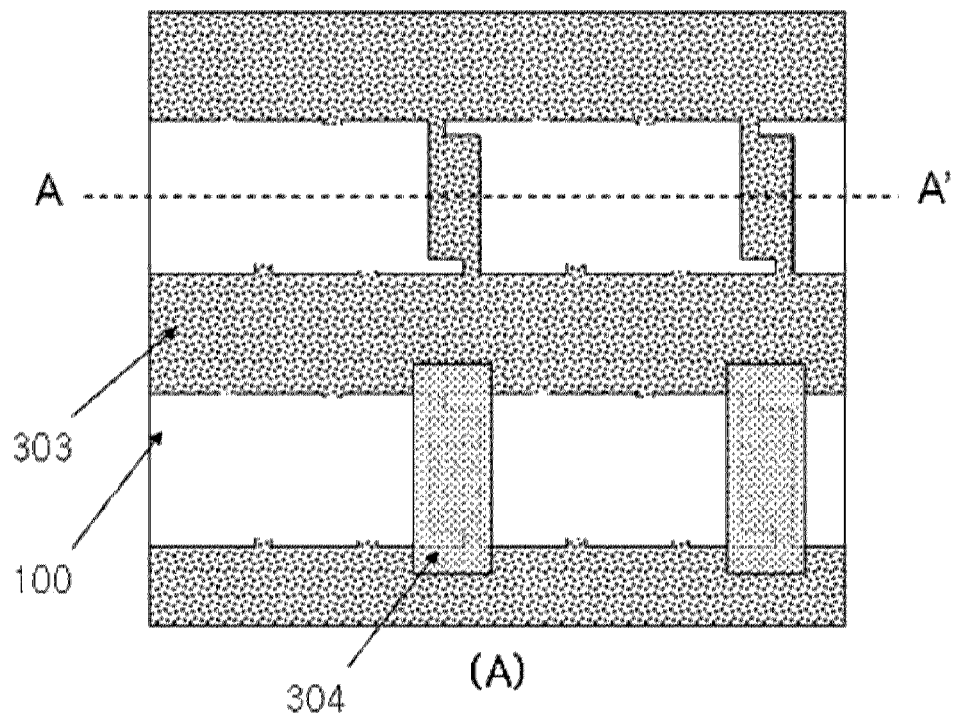
(A)
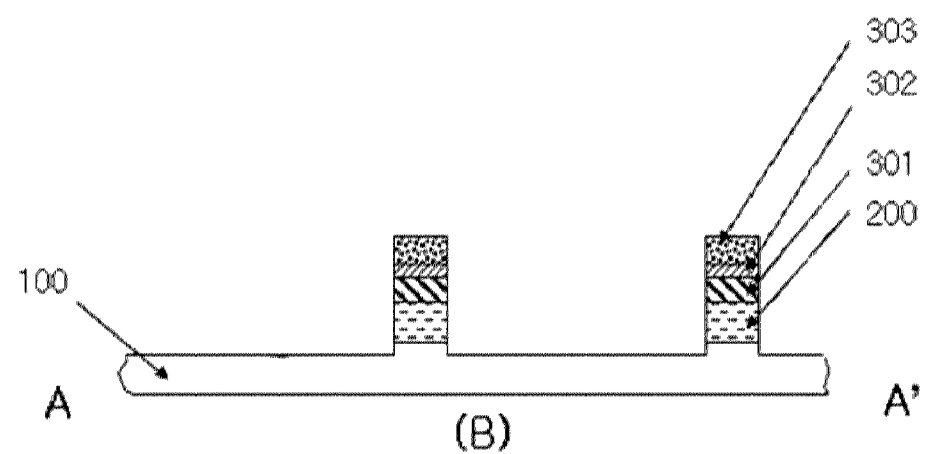
(B)

FIG.23
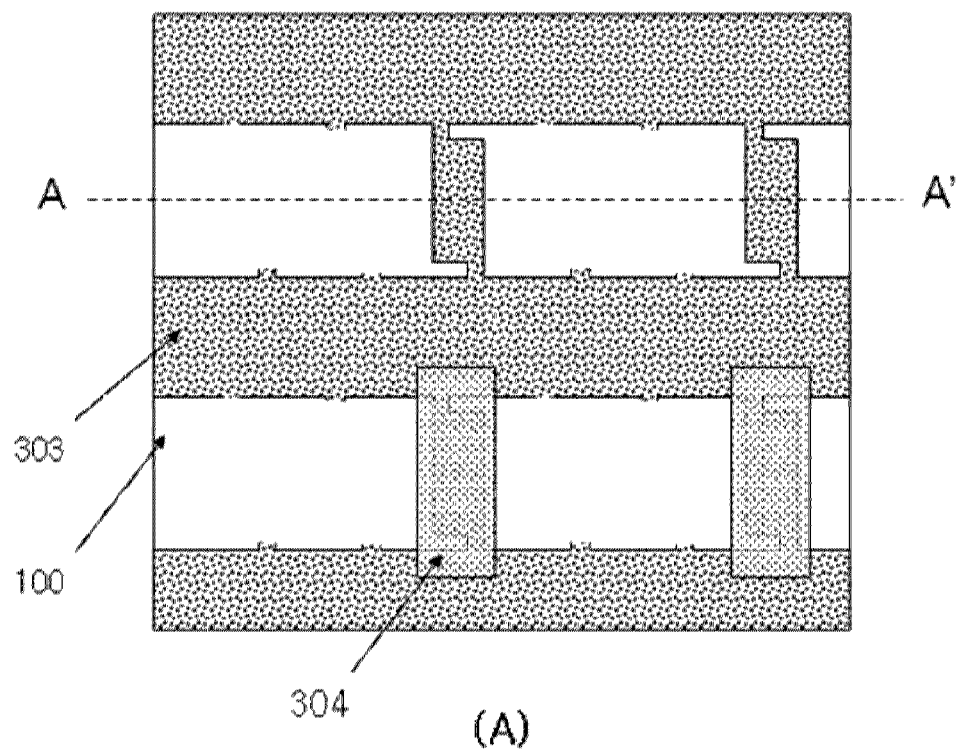
(A)
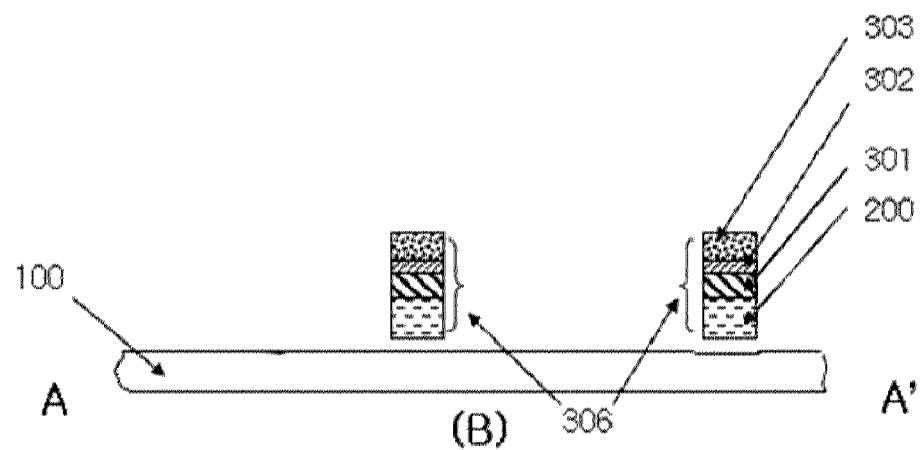
(B)

FIG.24
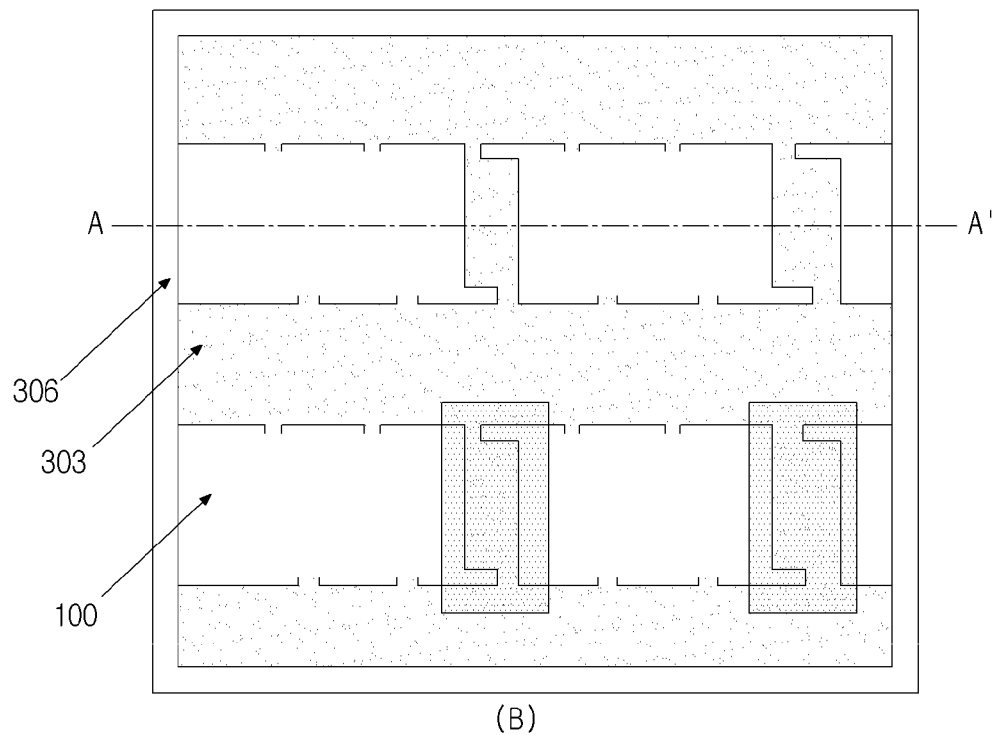
(B)
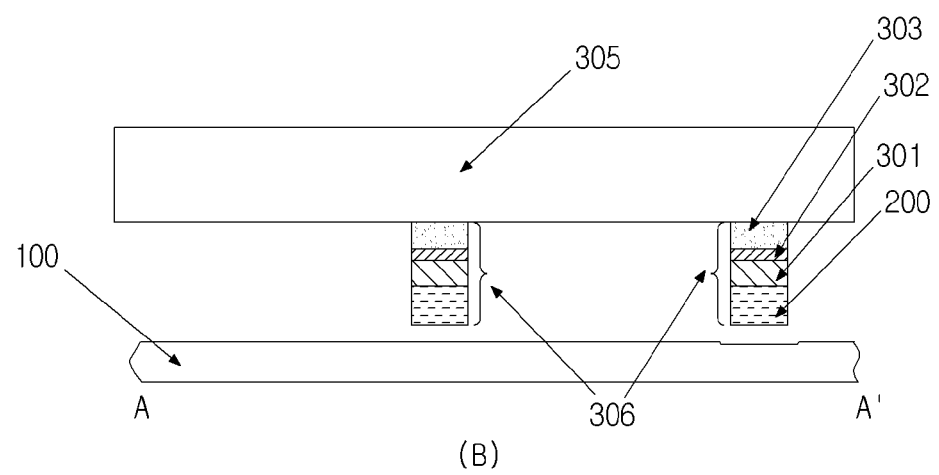
(B)

FIG.25
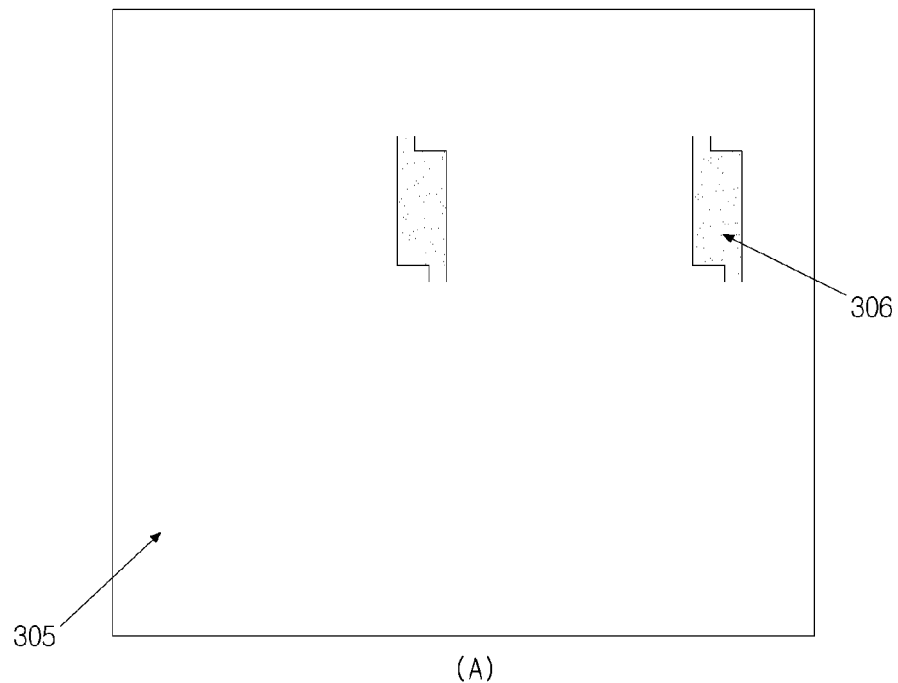
(A)
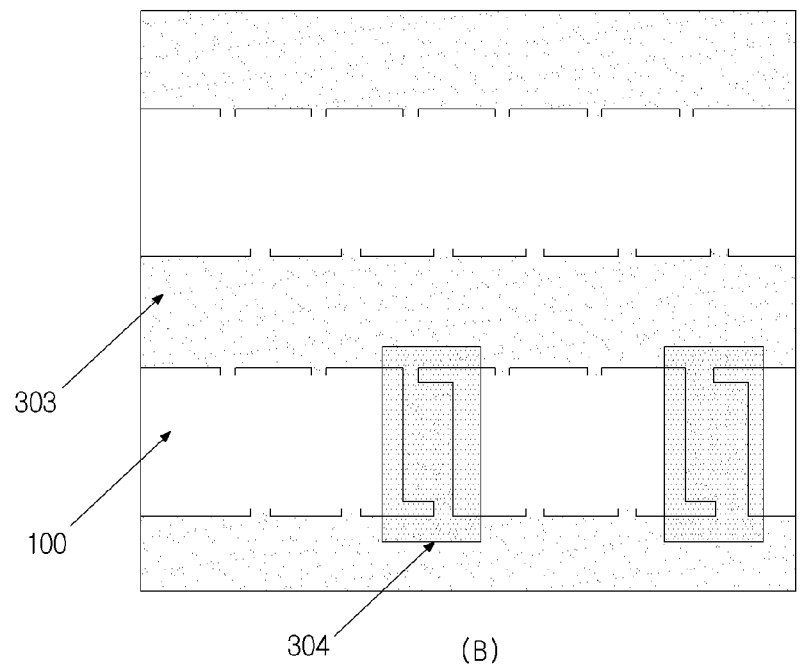
(B)

FIG.26
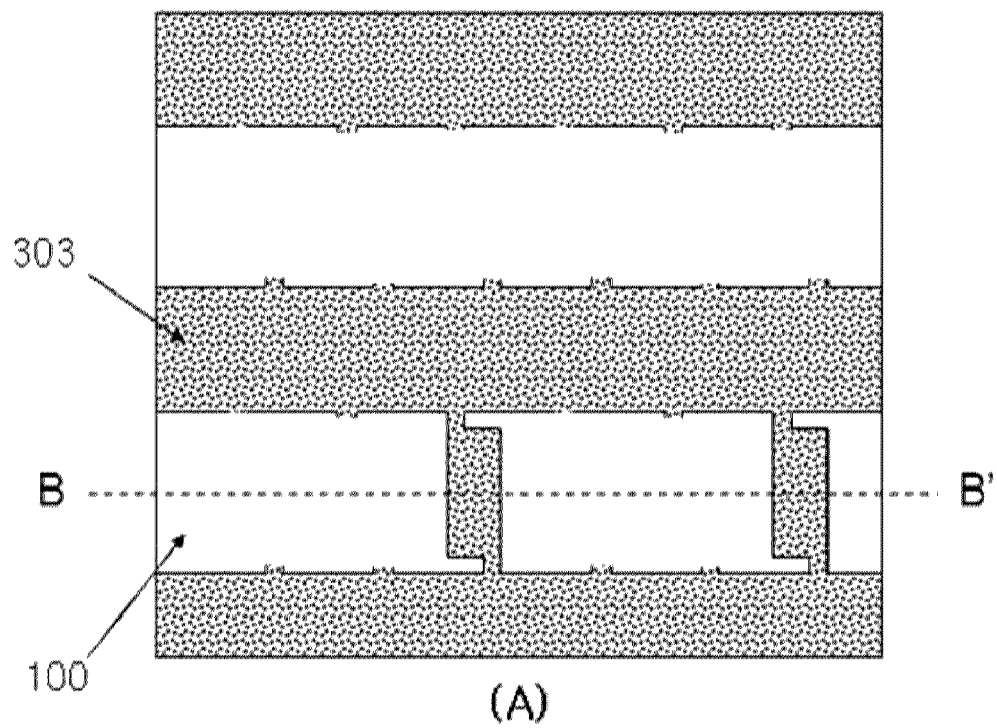
(A)
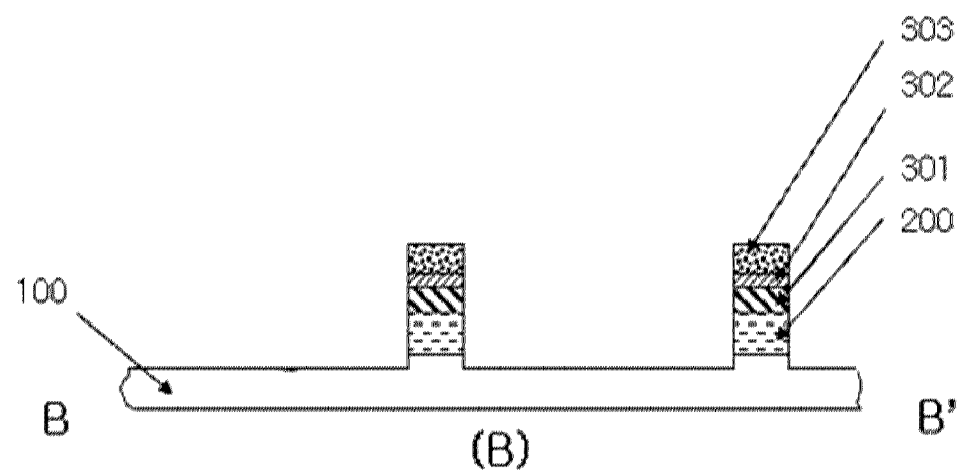
(B)

FIG.27
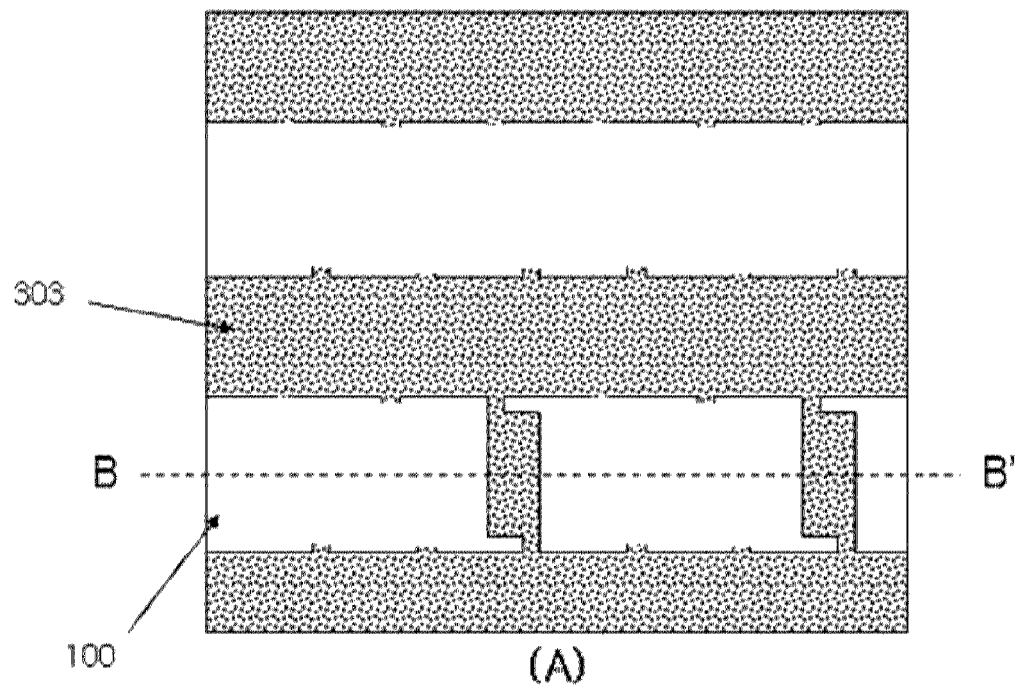
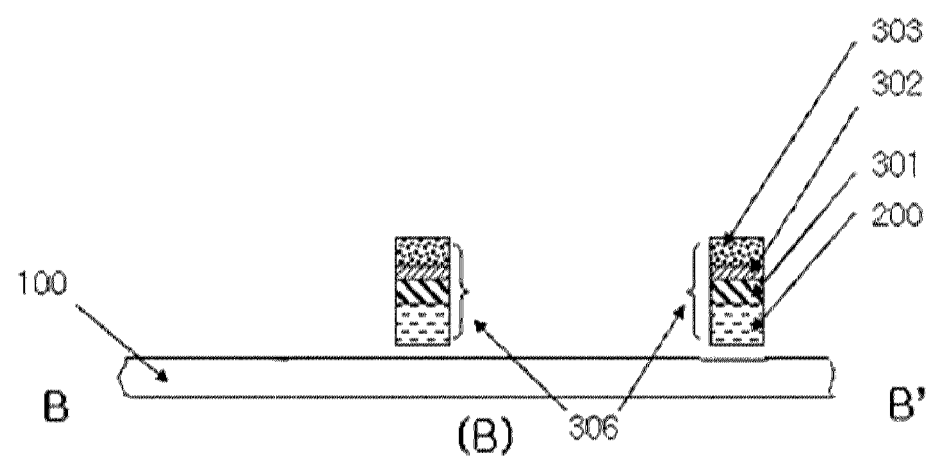

FIG.28
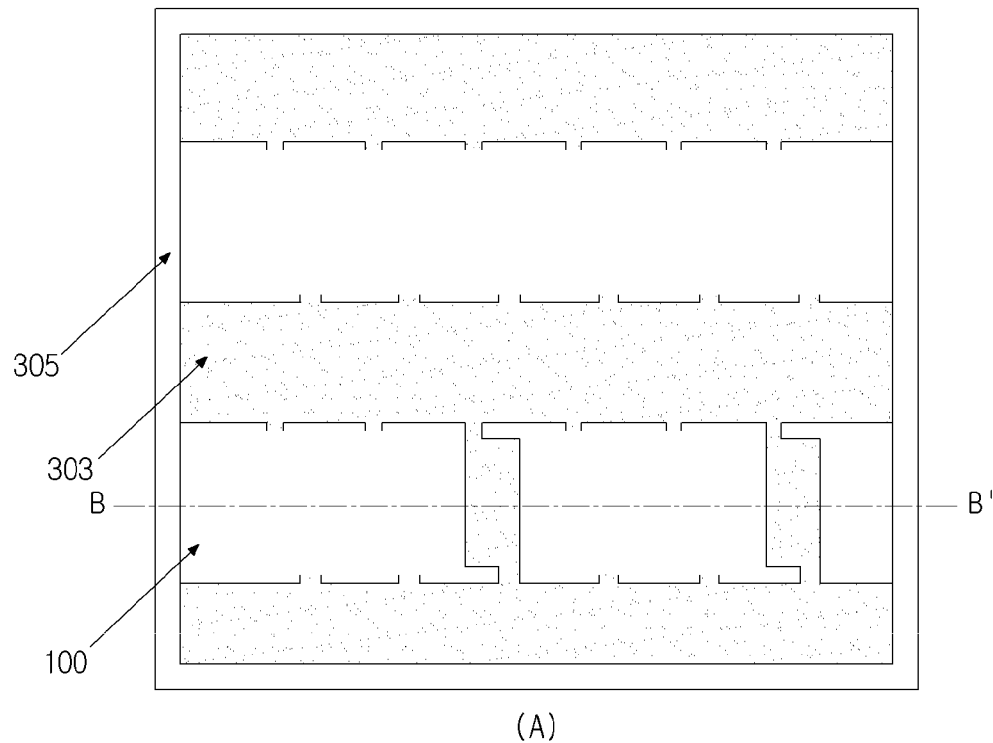
(A)
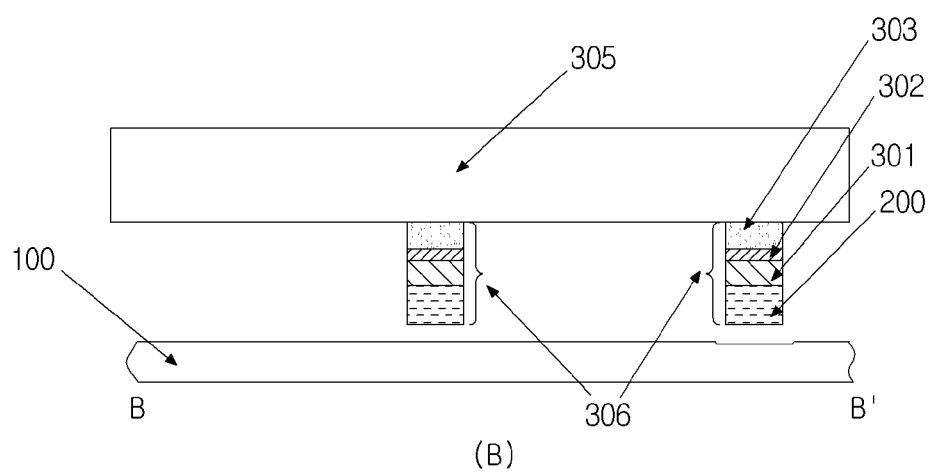
(B)

FIG.29
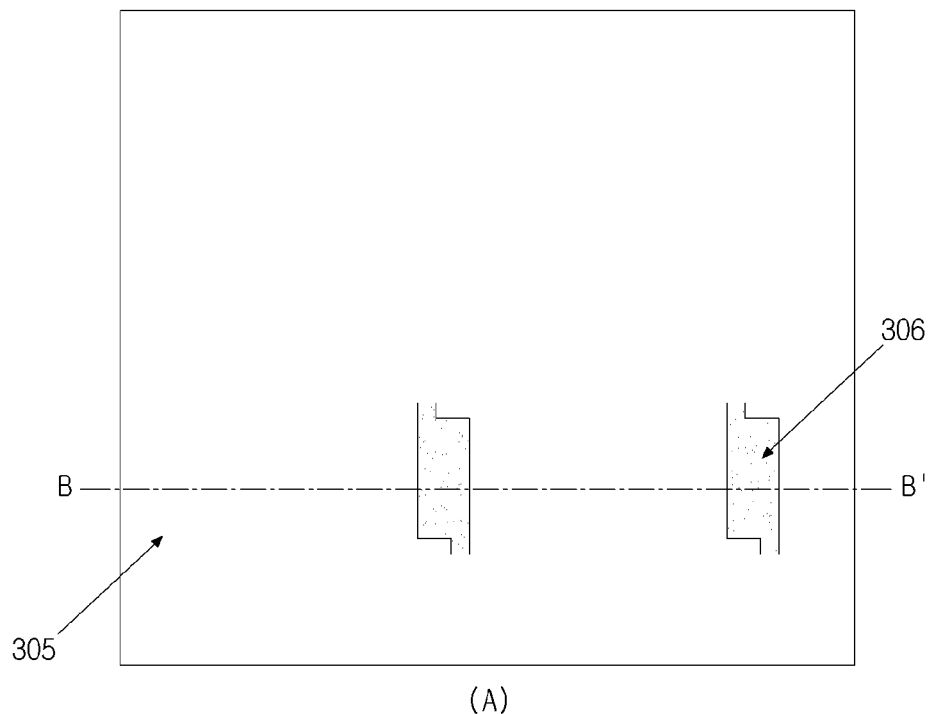
(A)
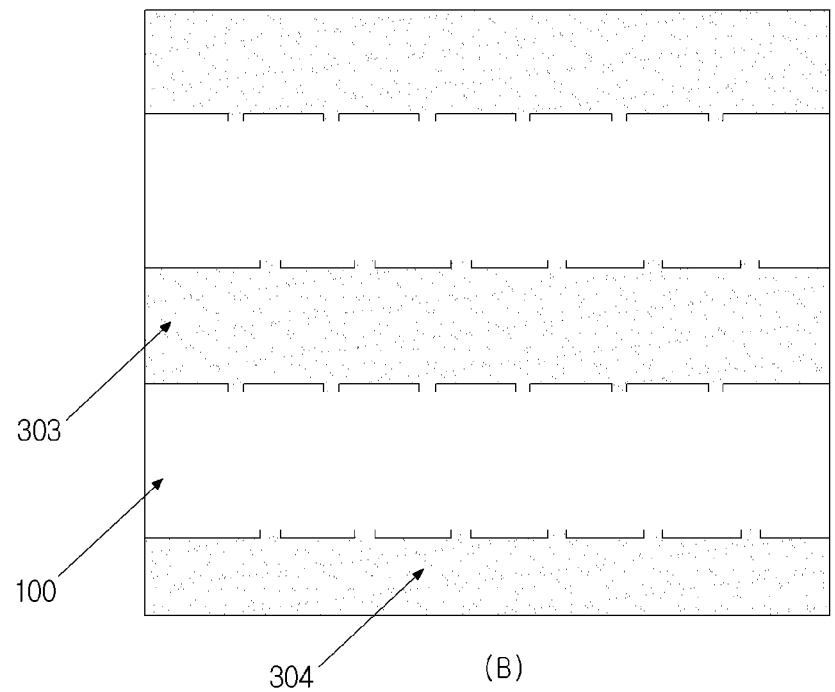
(B)

FIG.30
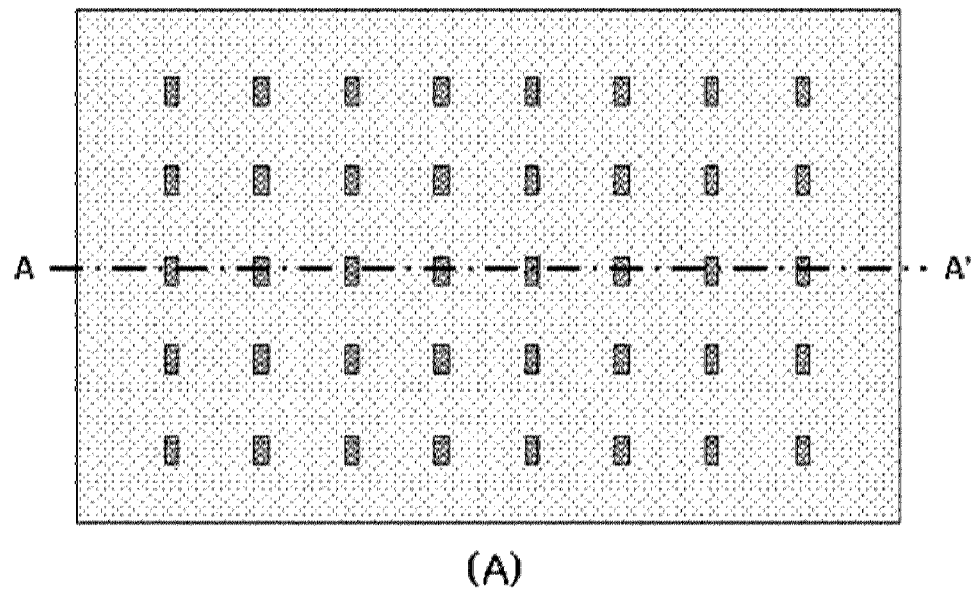
(A)
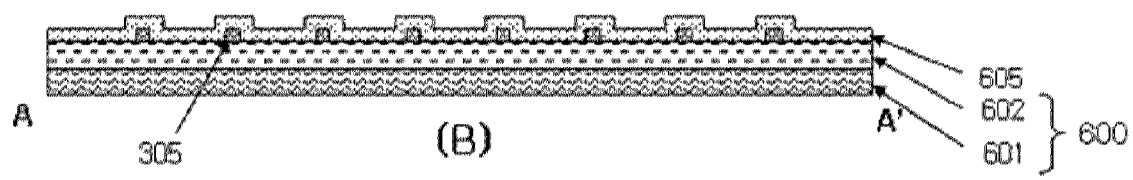
(B)

FIG.31
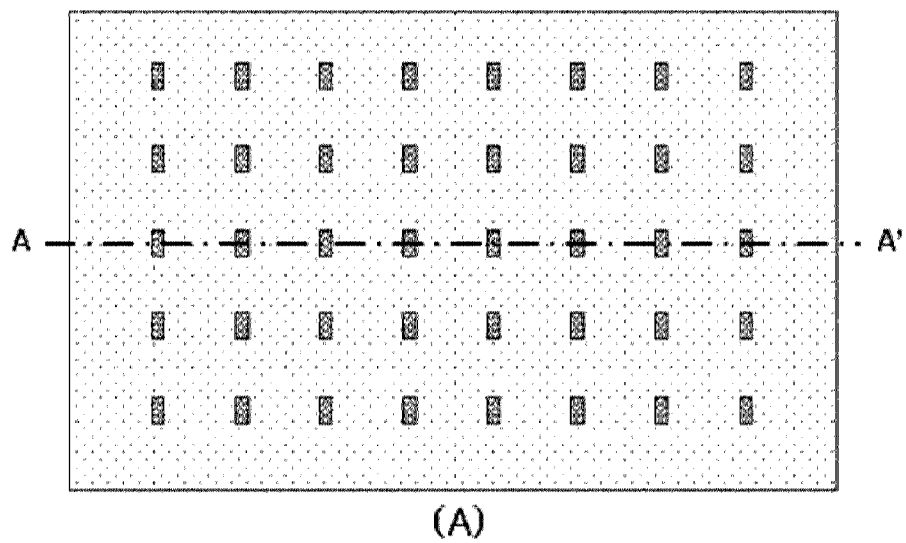
(A)
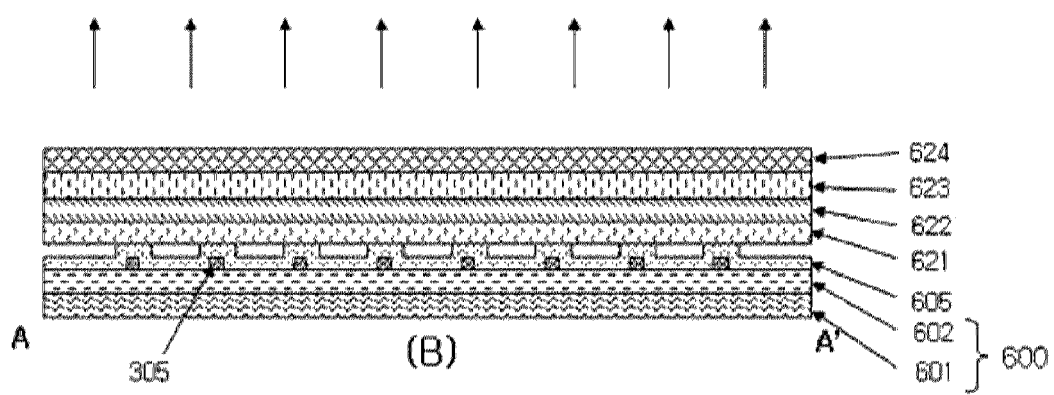
(B)

FIG.32
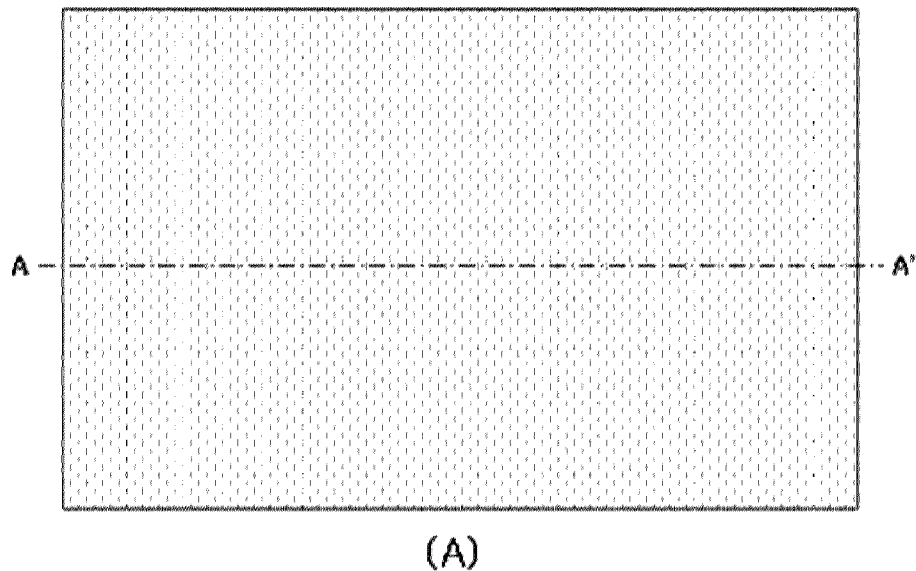
(A)
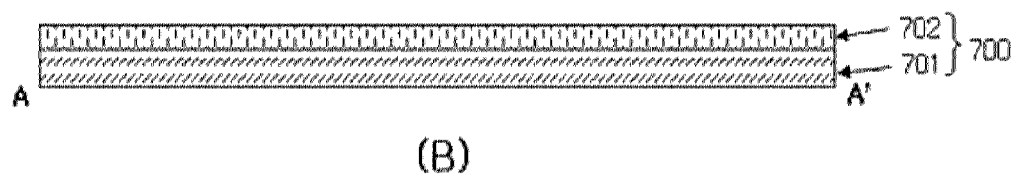
(B)

FIG.34
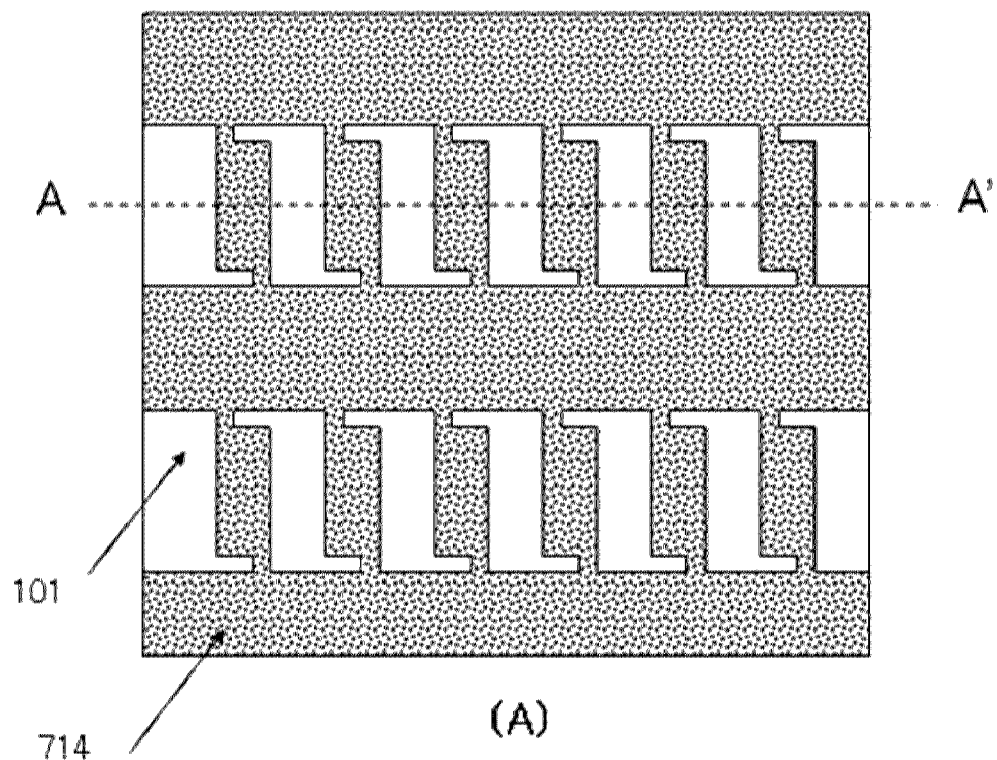
(A)
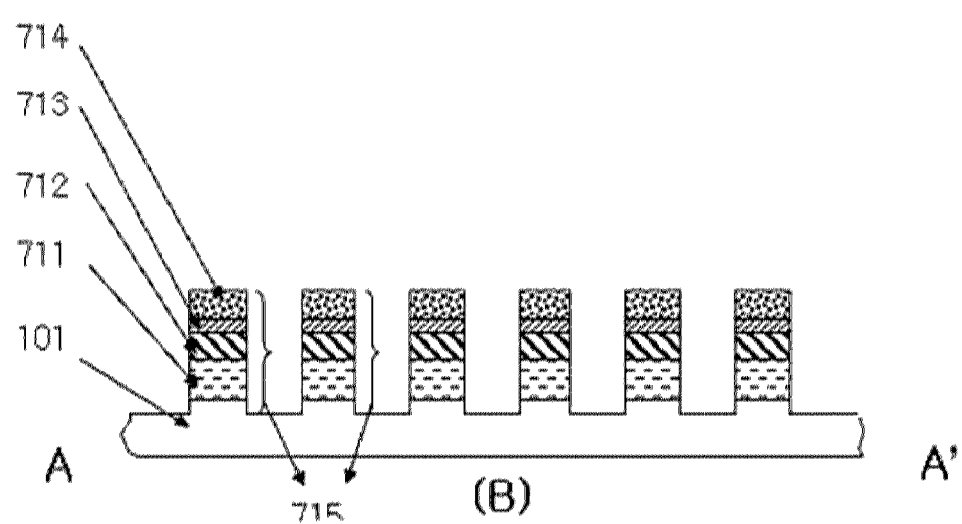
(B)

FIG.35
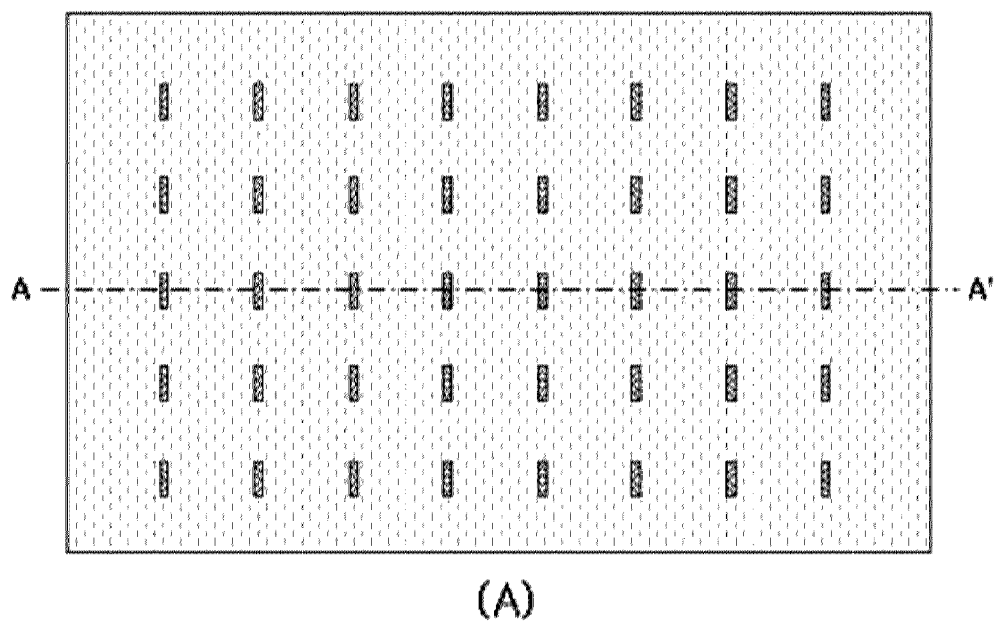
(A)
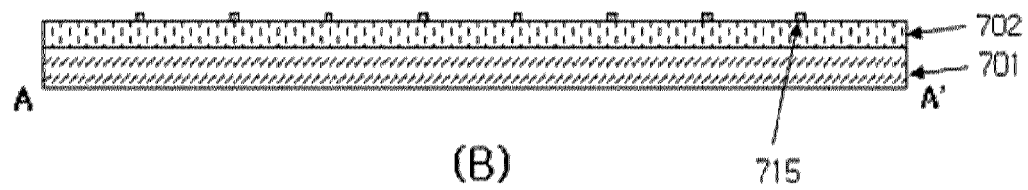
(B)

FIG.37
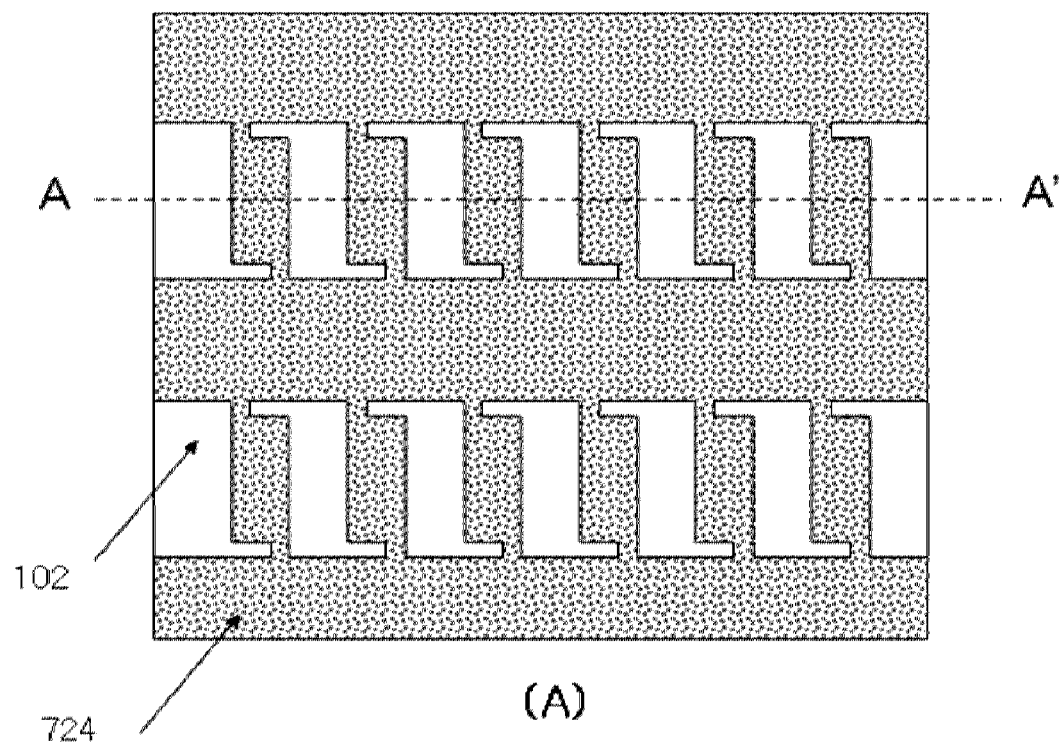
(A)
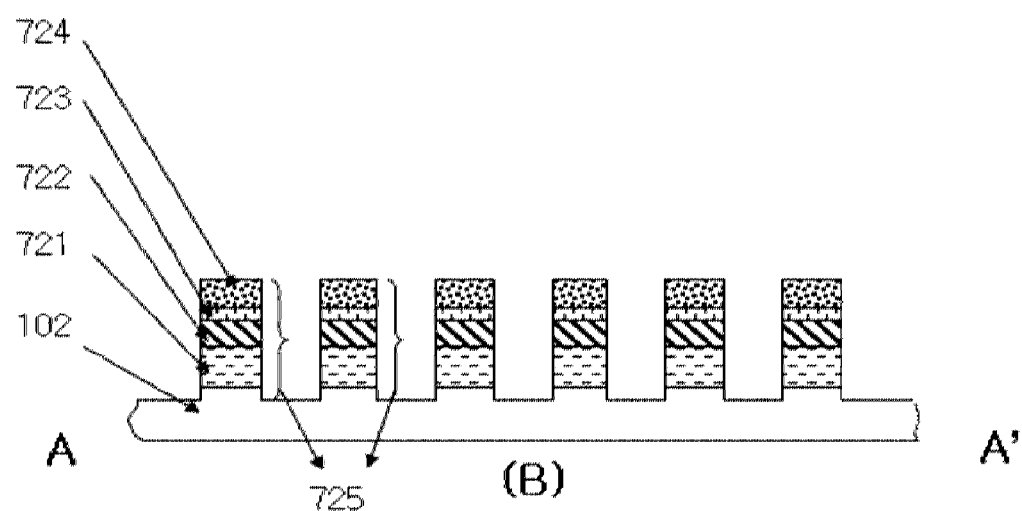
(B)

FIG.38
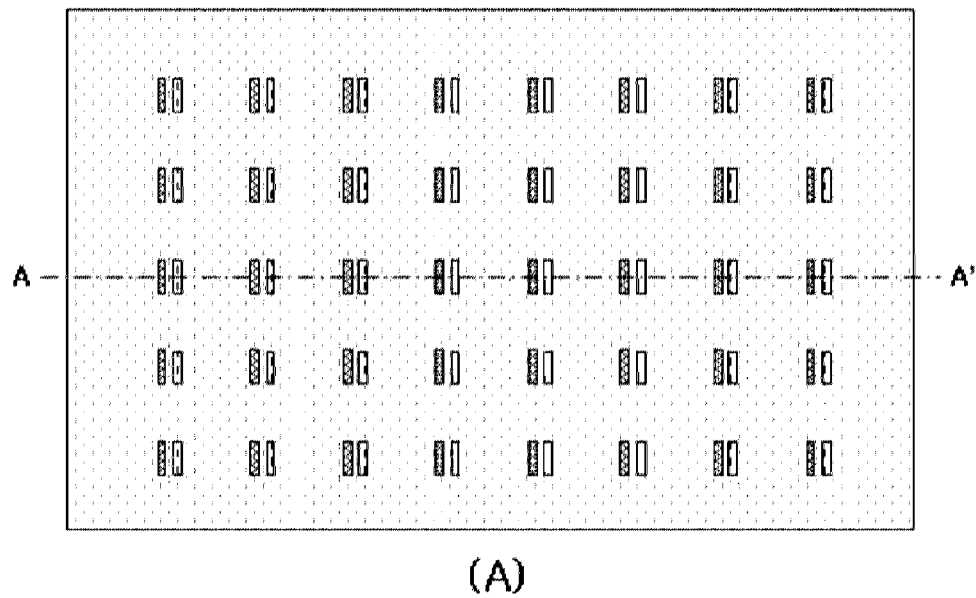
(A)
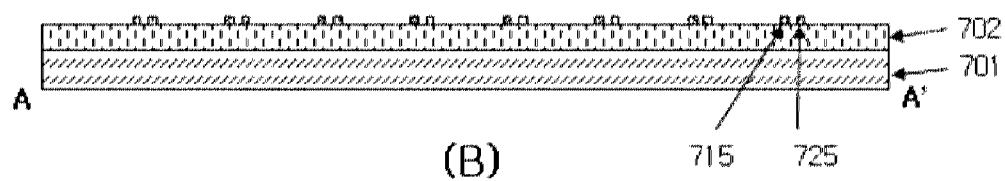
(B)

FIG.40
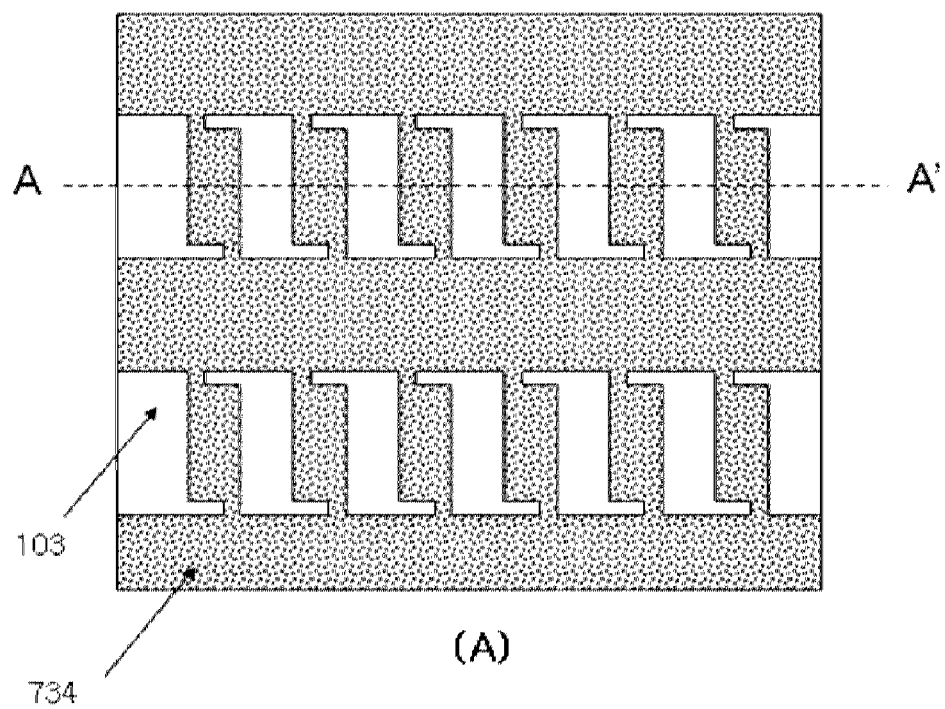
(A)
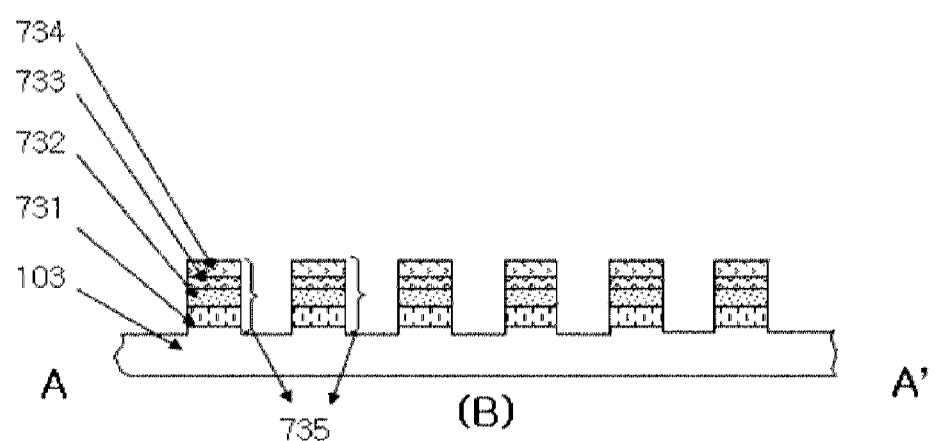
(B)

FIG.41
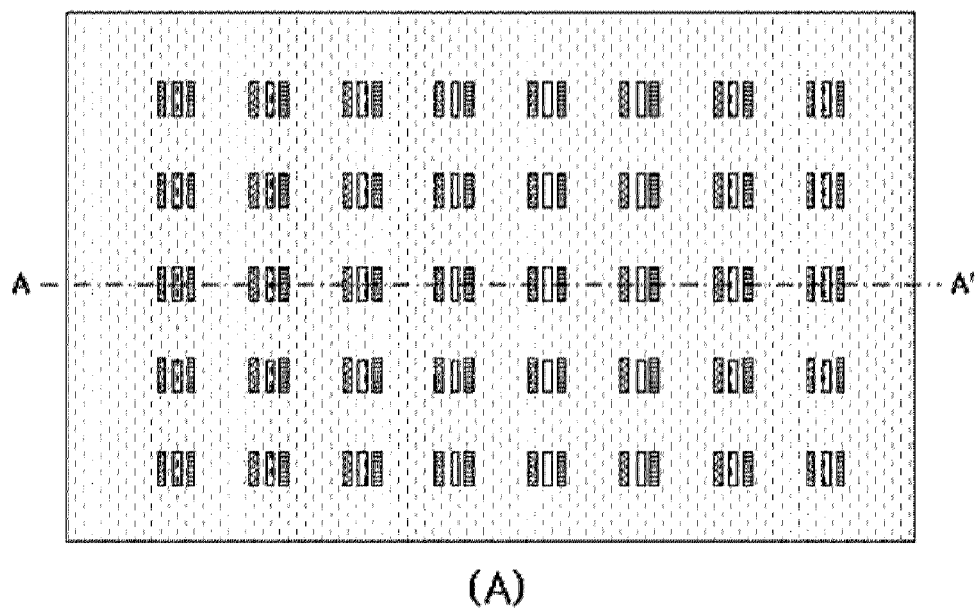
(A)
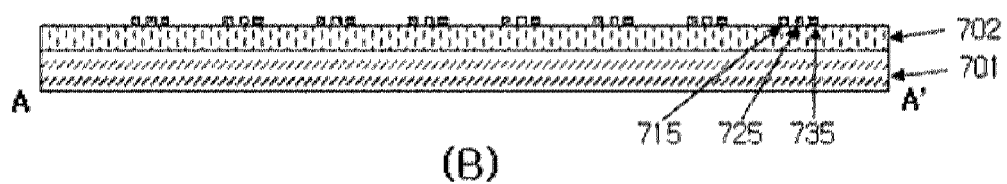
(B)

FIG.42
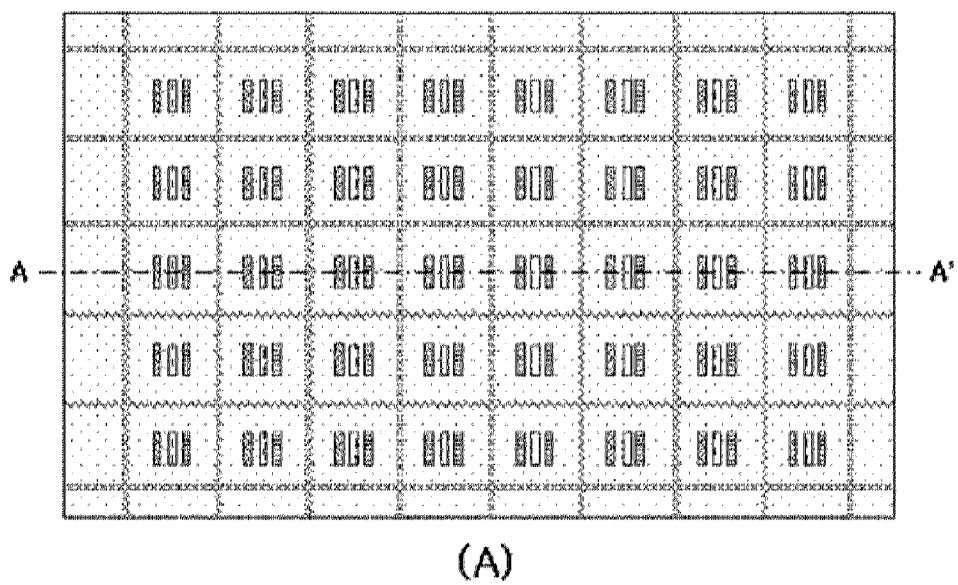
(A)
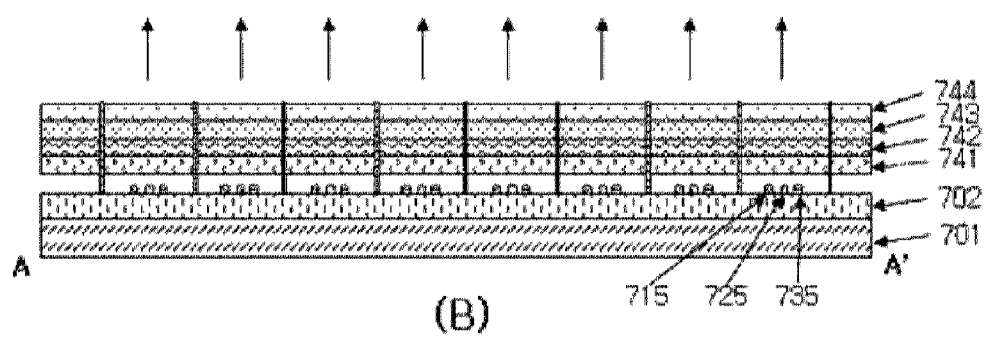
(B)

LIGHT EMITTING DIODE DISPLAY AND METHOD OF MANUFACTURING THE SAME

CROSS-REFERENCE TO RELATED APPLICATIONS

The present application claims the priority benefit of Korean patent application number 10-2009-0072832 filed Aug. 7, 2009, which is hereby incorporated by reference in its entirety.

BACKGROUND

The present disclosure relates to a Light Emitting Diode (LED) display and a method of manufacturing the same.

In information society, displays are visual information transfer mediums and their importance is being emphasized. Particularly, LEDs being one of semiconductor light emitting devices self emit light unlike Liquid Crystal Displays (LCDs) and Cathode Ray Tubes (CRTs), and thus they emit high-brightness light at a low power. Therefore, LED displays are getting the spotlight as the displays of various electronic devices.

As semiconductor devices for converting electrical energy into light energy, LEDs have the heterojunction structure of a p-type semiconductor and an n-type semiconductor, wherein the p-type semiconductor has holes as minority carriers and the n-type semiconductor has electrons as minority carriers.

In a high temperature condition, however, LEDs are manufactured by a semiconductor process requiring the use of various chemical materials, and thus it is impossible for the LEDs to currently overcome the limitations of a manufactured substrate, i.e., limitations that a rigid substrate such as a sapphire substrate or a silicon substrate should be used. For example, it is difficult to manufacture LED devices on glass substrates for display. The reason is because the glass substrate is easily melted in a high-temperature process.

SUMMARY

Embodiments provide an LED display which is manufactured in a new conceptual transfer process and a method of manufacturing the same.

In one embodiment, a method of manufacturing Light Emitting Diode (LED) display includes: forming an LED device layer in a sacrificial substrate; etching the LED device layer to manufacture at least two or more LED devices patterned; selectively removing the sacrificial substrate in a lower side of the LED device; connecting a stamping processor to the LED device, disconnecting the stamping processor, and selectively separating the LED device from the sacrificial substrate; and transferring the LED device, which is attached to the stamping processor, to a receiving substrate.

In another embodiment, a Light Emitting Diode (LED) display includes: a single display substrate having at least two or more pixels, and realizing an image by combination of the pixels; and three-color RGB LED devices defined as the pixels, and provided to the inside.

In further another embodiment, a method of manufacturing Light Emitting Diode (LED) display includes: providing a sacrificial substrate on which RGB LED device layers are formed, respectively; etching and patterning the LED device layer to manufacture RGB LED devices, respectively; removing the sacrificial substrate in a lower side of the LED device; contacting a stamping processor to the RGB LED devices to separate the RGB LED devices from the sacrificial substrate; and transferring the LED device, which is attached to the stamping processor, to a receiving substrate.

The details of one or more embodiments are set forth in the accompanying drawings and the description below. Other features will be apparent from the description and drawings, and from the claims.

The LED display and method of manufacturing the same according to embodiments transfer an LED device, which is manufactured on a sacrificial substrate by a high temperature process, to a receiving substrate exemplified as a glass substrate that is provided to a backlight unit (BLU) with a stamping processor exemplified as PolyDiMethylSiloxane (PDMS). Therefore, the limitations of the substrates of LED devices that are manufactured in a related art silicon substrate or sapphire substrate cannot be overcome.

Moreover, blue, red and green (RGB) LED devices that are respectively manufactured in sacrificial substrates are arranged while having a high degree of arrangement with respect to a large-size substrate by respective stamping processors or a single stamping processor, and thus a new LED display enabling the direct realization of full colors can be manufactured. Also, since a manufacturing process for mass production can be applied, the manufacturing costs of LED displays can be largely saved.

BRIEF DESCRIPTION OF THE DRAWINGS

FIGS. 1 to 28 are views illustrating a process where an LED device is transferred to a backlight unit including a glass substrate in a method of manufacturing LED display according to an embodiment.

FIGS. 30 and 31 are views illustrating a method of manufacturing LED display according to an embodiment and a backlight unit manufactured by the same.

FIGS. 32 to 41 are views illustrating a method of manufacturing LED display according to another embodiment.

FIG. 42 is a view illustrating an LED display where RGB LEDs are disposed in each pixel.

DETAILED DESCRIPTION

Figure 2:
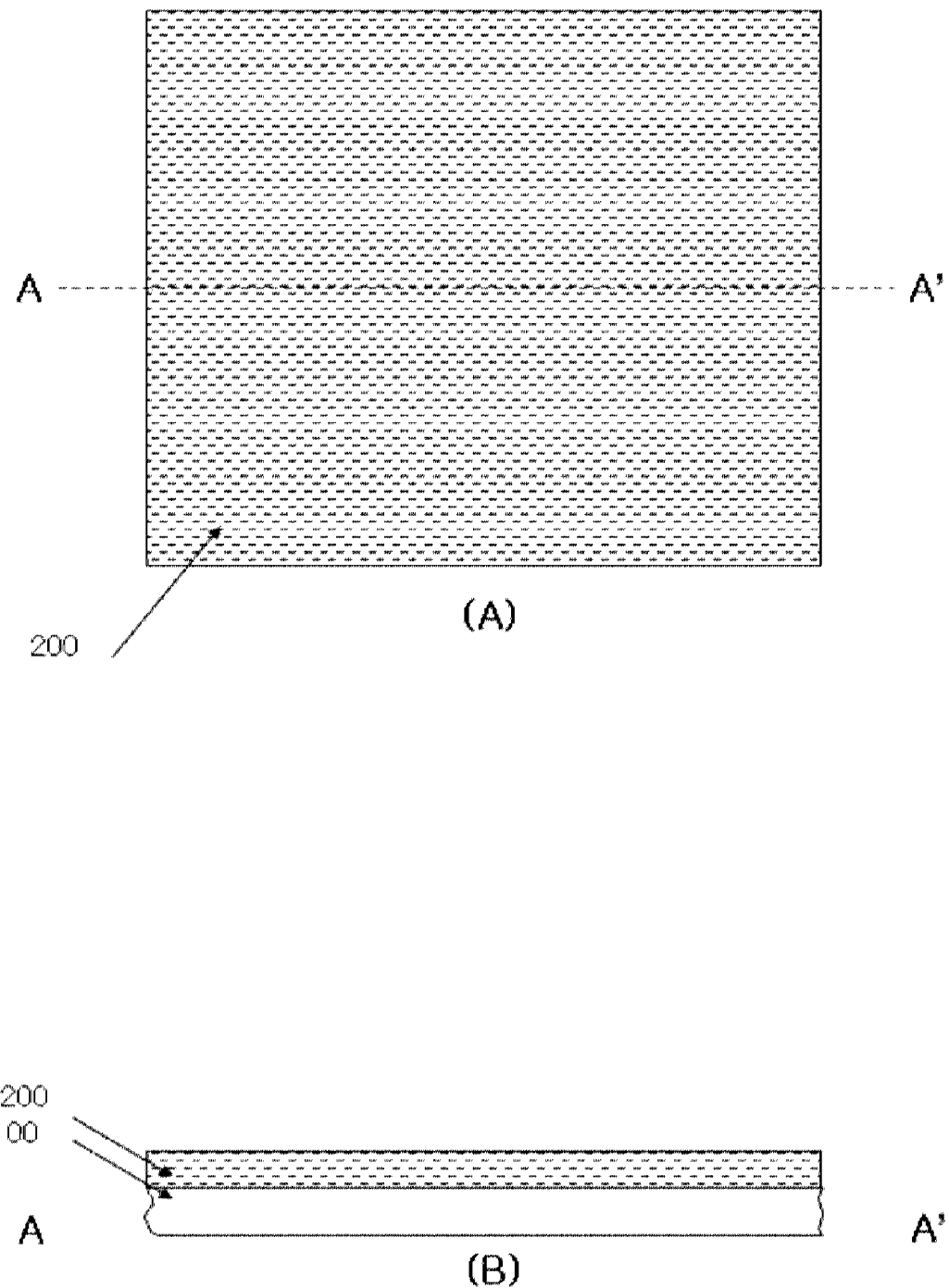

Reference will now be made in detail to the embodiments of the present disclosure, examples of which are illustrated in the accompanying drawings. In the drawings, the width, length and thicknesses of each element are exaggerated for convenience. Like reference numerals refer to like elements throughout, and the accompanying drawings may be understood as an entire plan view and a cross-sectional view taken along a partial cross-sectional surface A-A'.

According to embodiments, as described above, an LED device layer is manufactured and patterned in a rigid sacrificial substrate (for example, a silicon substrate or a sapphire substrate) that may grow an LED at a high temperature, and thus an LED device is manufactured. Subsequently, the LED device manufactured in the sacrificial substrate is selectively separated from the sacrificial substrate, and thereafter provided is an LED display and a method of manufacturing the same which directly transfer the LED device to a receiving substrate exemplified as a substrate stacking an LED or a glass substrate that is provided to a backlight unit by a stamping processor exemplified as PDMS.

FIGS. 1 to 28 are views illustrating a process where an LED device is transferred to a backlight unit including a glass substrate in a method of manufacturing LED display according to an embodiment.

Referring to FIG. 1, a silicon substrate 100 is exemplified as a sacrificial substrate where an LED device is first manufactured and separated. Herein, the sacrificial substrate denotes a substrate that efficiently endures a specific condition such as a high-temperature condition that is required in the manufacturing of the LED device and maintains the alignment structure of a device as-is even when a high-temperature process is performed. For example, a silicon substrate, a sapphire substrate or a SiC substrate may be used as the sacrificial substrate. As another example, the sacrificial substrate may be an arbitrary substrate where LED devices are aligned at certain regularity, but a substrate that is directly used for the stacking of an LED device layer at a high temperature may be implemented as the sacrificial substrate.

Referring to FIG. 2, an AlN buffer layer 200 is stacked on a silicon substrate 100. The buffer layer 200 softens lattice mismatch between the silicon substrate 100 and a GaN layer being a group III-V semiconductor and stably couples a semiconductor layer to a sacrificial substrate. As a process of stacking the AlN buffer layer 200, for example, there may be a Metal Organic Chemical Vapor Deposition (MOCVD) process that is used in the related art.

Figure 3:
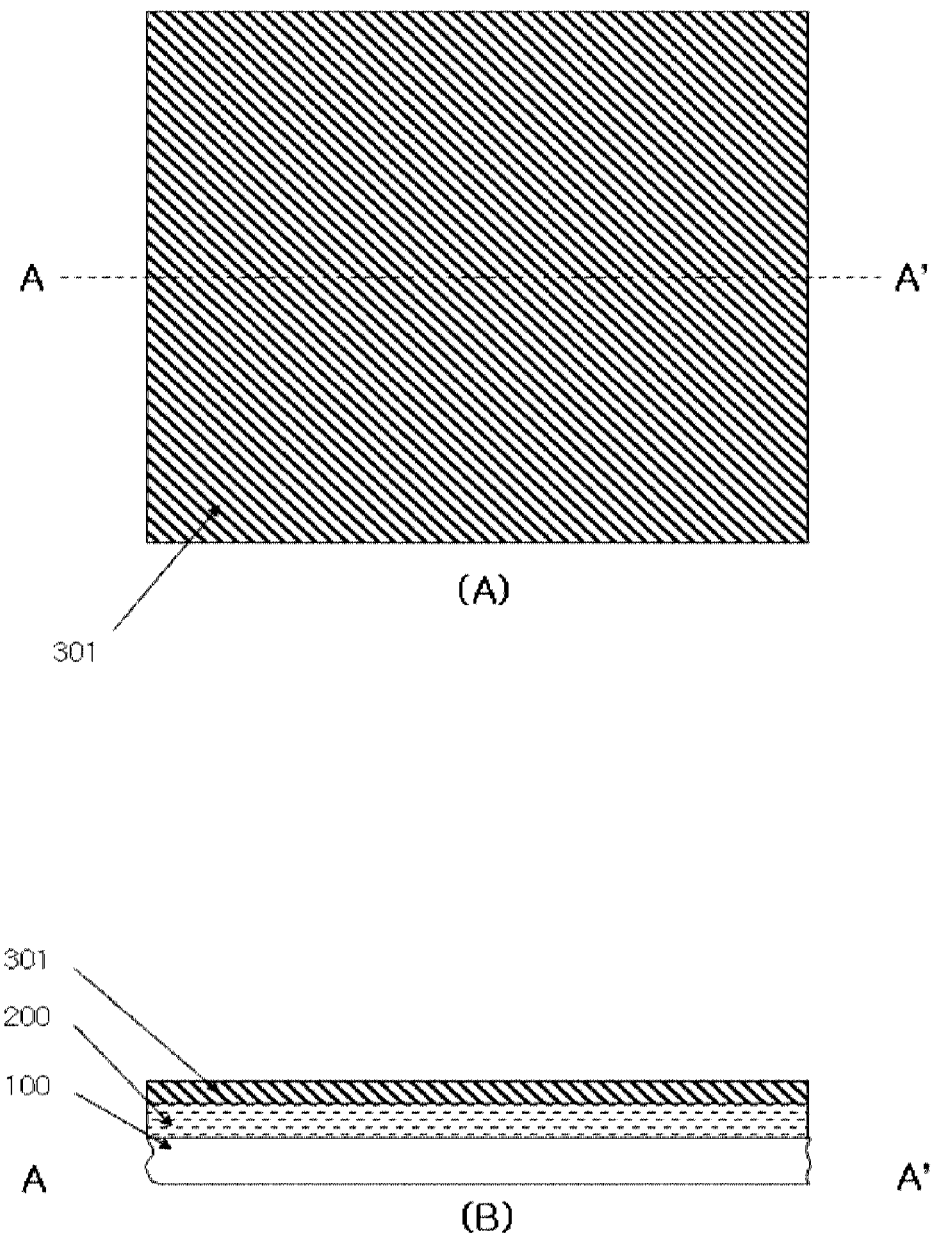

Referring to FIG. 3, an n-GaN layer 301 being the base layer of an LED device is grown and stacked on the AlN buffer layer 200. The n-GaN layer 301 is an n-type semiconductor layer, and may be grown by an epitaxial process on the AlN buffer layer 200.

Referring to FIG. 4, a GaN/InGaN layer 302 is stacked on the n-GaN layer 301, and a p-GaN layer 303 is stacked on the GaN/InGaN layer 302. Therefore, an LED device layer having an n-GaN/(GaN/InGaN)/p-GaN type is completed on the sacrificial substrate.

A process of manufacturing LED device, particularly, a process of stacking LED device layer is not limited to the above-described process, and may be performed in various manufacturing methods based on the structures of LEDs and various materials in accordance with the kinds of LEDs known. A GaN-based semiconductor and a GaAs-based semiconductor may be applied. An LED device layer is stacked, and thereafter the LED device layer manufactured in the sacrificial substrate is patterned. In the patterned LED device layer, a portion used in the LED display, i.e., an LED device is separated from the sacrificial substrate and is transferred to a backlight unit including a glass substrate. According to an embodiment, disclosed is a method of manufacturing LED device where a poor process (particularly, high-temperature environment) required in the manufacturing process of an LED device is performed in a sacrificial substrate such as a silicon substrate, and a relatively non-poor process (particularly, low-temperature environment) is performed in a glass substrate.

Referring to FIG. 5, an n-GaN/(GaN/InGaN)/p-GaN layer (device layer) manufactured in the sacrificial substrate is selectively etched and patterned. A portion of the an n-GaN/(GaN/InGaN)/p-GaN device layer is etched by the patterning, and thus an LED device (a) of a certain region is formed which is used in an actual LED display. An LED device used in an embodiment denotes a portion of the structure of an LED device layer having a region and a shape used in the actual LED display. Also, the LED device (a) formed on the sacrificial substrate is connected to a device layer (c), which is not still etched by a bridge (b), on a substrate. As a result, the LED device (a) has a high degree of alignment and fixed disposition. Herein, the length of the long side of the LED device may be controlled from about 500 nm to 100 μm. This is a controllable range by a current etching technology, and the length of the long side of the LED device may be controlled to a finer range with the advance of an etching technology.

Moreover, a portion etched by an etching process includes a device layer on a sacrificial substrate, i.e., the AlN buffer layer 200, the n-GaN layer 301, the GaN/InGaN layer 302 and/or the p-GaN layer 303, and also a portion of the sacrificial substrate 100 in the lower portion of the device layer is vertically etched. A side surface portion of the partially-etched sacrificial substrate may be a start point of an anisotropic etching process in a parallel direction instead of a vertical direction. This will be described below in detail with reference to FIG. 6.

Referring to FIG. 6, a passivation layer 304 is stacked in an LED device region requiring no separation and transfer among one or more LED devices. The passivation layer 304 prevents an undesired LED device from being etched and separated in an anisotropic etching process. However, the passivation layer 304 may not be used, and in this case, the anisotropic etching process of FIG. 7 may be immediately performed. Silicon oxide ($SiO_2$) is used as the passivation layer 304, but it is not limited thereto. Also, the passivation layer 304 is stacked to the side surface of an LED device requiring no separation. The reason is because the side surface of a sacrificial substrate in a lower portion of the LED device is the start point of an anisotropic etching process that is immediately subsequently performed.

Referring to FIG. 7, a lower sacrificial substrate of an LED device that is not prevented by the passivation layer 304 is etched. Thus, the LED device is separated from the sacrificial substrate. The etching of the sacrificial substrate may be performed in various processes, but it may use an anisotropic etching process that uses etching solution where the etching speed of a parallel direction is superior to the etching speed of a vertical direction. For example, in the case of single crystal silicon of (111), it may be used that the directionality of conformal side surface etching may be reached when the rubbing of an etching direction of anisotropic etching by wet etching is (110). At this point, when etching solution such as TMAH or KOH solution is used, an etching speed is varied with a crystal direction (the etching speed of (101):(100):(111)=300:600:1). As a result, anisotropic etching may be efficiently performed in the direction of (110), i.e., a parallel direction. Even in this state, an LED device can maintain a state where it is aligned at the original position by a bridge (b).

Figure 8:
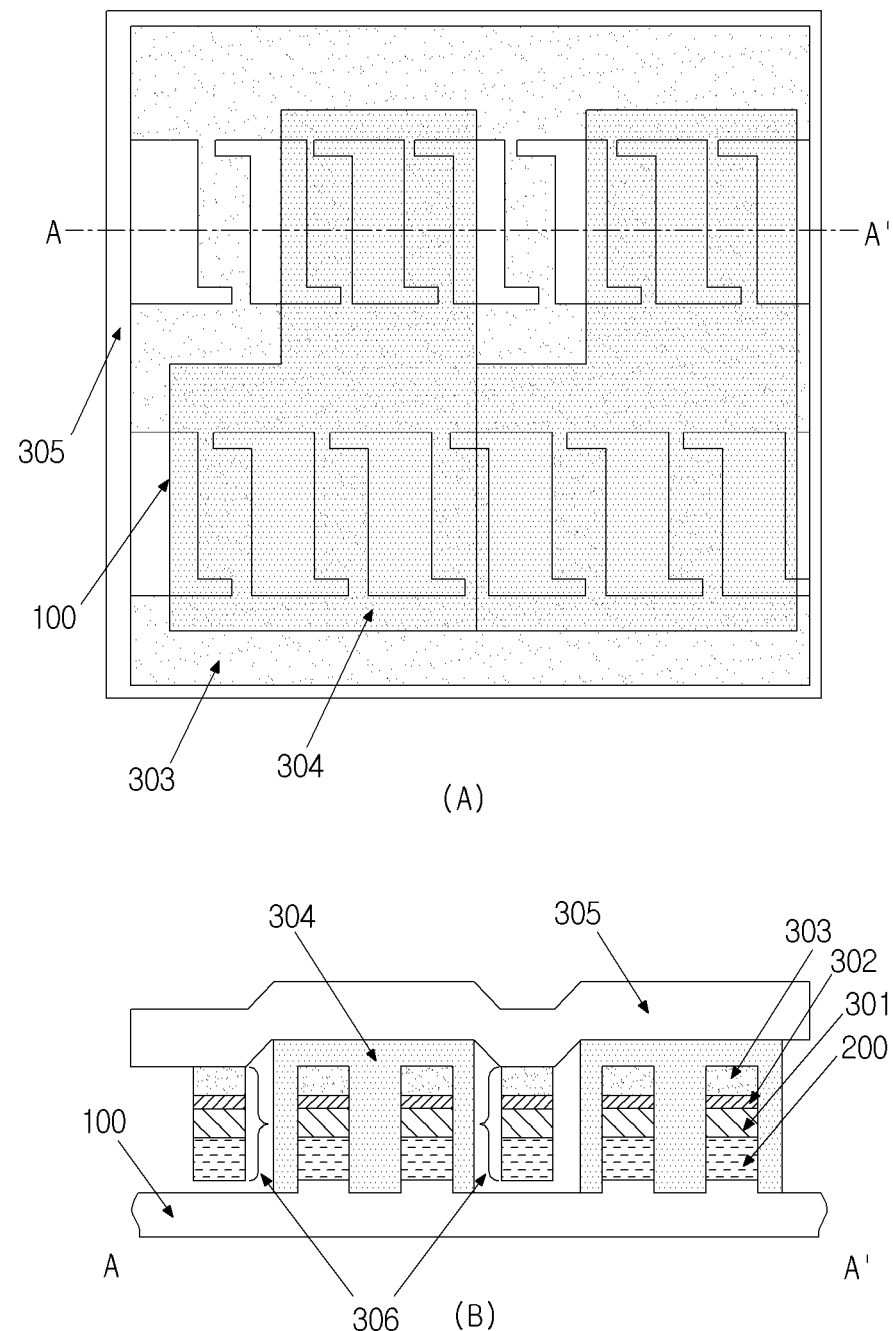
Figure 12:
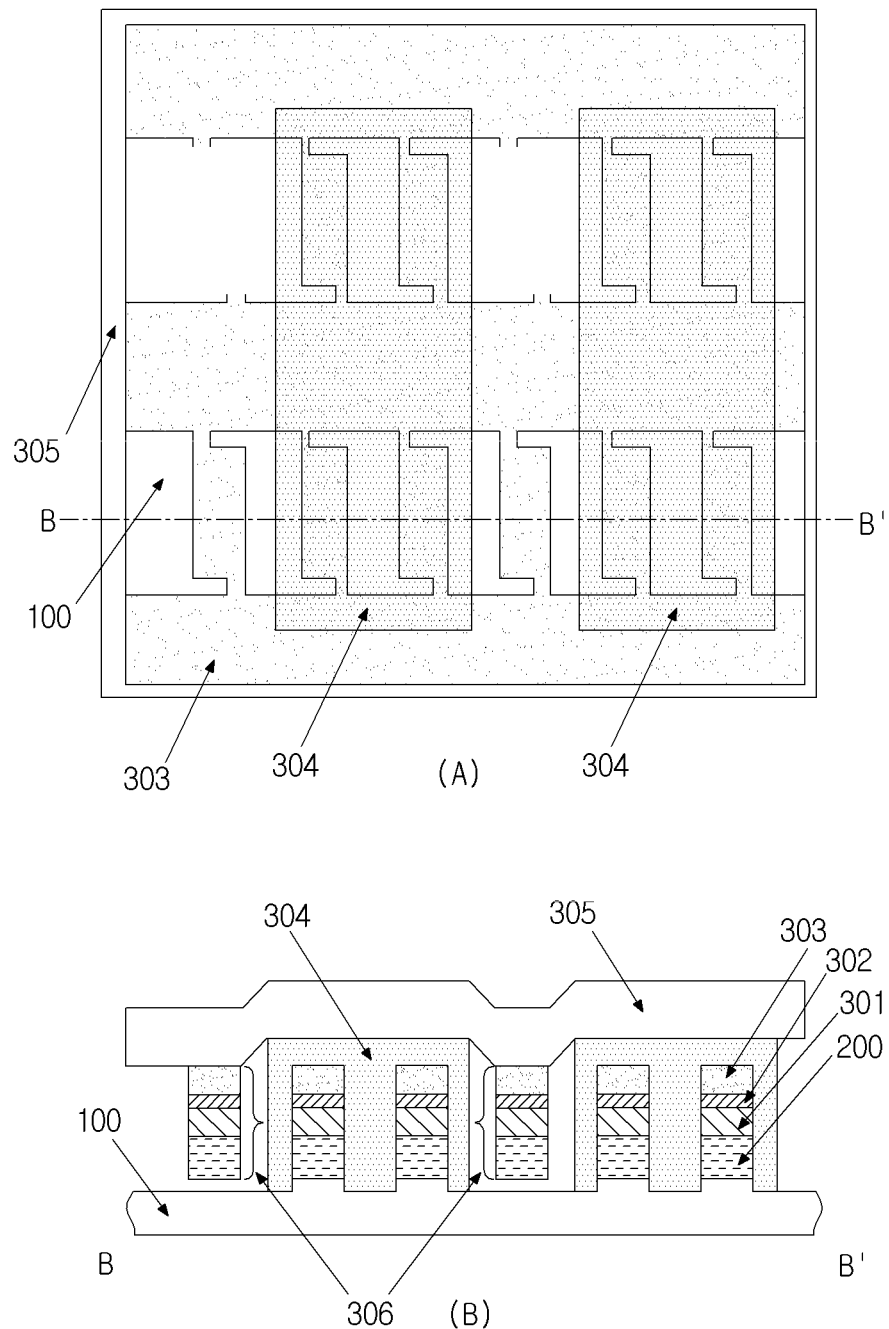

Referring to FIG. 8, PDMS 305 contacts an LED device having no passivation layer, and therefore the LED device is attached to the PDMS 305. However, an LED device protected by the passivation layer 304 is screened by the passivation layer 304 and thus does not contact the PDMS 305. Furthermore, the LED device is not separated through a next process by the PDMS 305.

Referring to FIG. 9, an LED device 306 that is attached by contacting the PDMS 305 is separated from a sacrificial substrate by demounting the PDMS 395. At this point, the LED device 306 is also demounted like the PDMS 305.

Through such a process, only a desired LED device may be continuously separated from a sacrificial substrate according to the appropriate stacking and removing of a passivation layer. A process, which sequentially and continuously separates LED devices manufactured on a sacrificial substrate in the above-described process, is illustrated in FIGS. 10 to 21. Referring to FIGS. 10 to 21, a process may be seen where a plurality of LED devices manufactured on the same substrate are sequentially separated. Naturally, the LED devices may be separated in various orders and types according to the disposition of the passivation layer 304. The method of manufacturing LED display according to an embodiment may selectively and sequentially transfer LED devices that are manufactured in a sacrificial substrate and have an excellent degree of alignment. Furthermore, since an LED device on a sacrificial substrate may be transferred to a receiving substrate in a certain disposition state, it may be transferred to a display device such as a backlight unit in a conformal disposition state. In this case, an LED device may be transferred in a size that is matched in the pixel units of an image display device. For smooth transfer, a bonding layer may be provided to the contact surface of the receiving substrate.

Hereinafter, a process will be described where an LED device on a sacrificial substrate is entirely transferred to a backlight unit in s conformal disposition state. Referring to FIGS. 22 to 30, it can be seen that the LED display including the backlight unit is manufactured where an LED device is transferred in a certain disposition state by the above-described process. Herein, the backlight unit is a term that denotes an LED support substrate including a glass substrate, and may include a glass substrate and a reflector stacked on the glass substrate.

Referring to FIG. 22, disclosed are one or more LED devices that are spaced apart at predetermined intervals and are manufactured on the sacrificial substrate 100. Particularly, FIG. 22 illustrates a pair of LED devices vertically separated among LED devices that are disposed on an entire sacrificial substrate, wherein another LED device is in a state where it has already been removed. Herein, the disposition state of an LED device on the sacrificial substrate may differ from the disposition state of the each pixel of the LED display. Also, the LED display may be exemplified as a backlight unit, or may be one that uses an LED, which directly outputs an image by controlling an applied current, as an emitting device. More specifically, the spaced state of the respective pixels of the LED display may have a multiple relationship with the spaced state of the LED devices on the sacrificial substrate. In FIG. 22, it is exemplarily illustrated that three times the interval between the LED devices on the sacrificial substrate is the interval between the respective pixels of the LED display. This is because an LED device is demounted one time among three times.

Referring FIGS. 22 to 25, a pair of LED devices in the upper sides of FIGS. 22 to 25 are transferred to a backlight unit 600 by the PDMS 305. At this point, it is as described above that the selective transfer of the LED device is performed by the passivation layer 304 such as silicon oxide. Referring FIGS. 26 to 29, a pair of LED devices in the lower sides of FIGS. 26 to 29 are transferred to the backlight unit 600 by the PDMS 305. According to such a process, it can be seen that all LED devices having a specific interval on a sacrificial substrate may be transferred to a backlight unit exemplified as a receiving substrate. Furthermore, it can be seen that an LED device having the same spaced distance and arrangement as those of the transferred LED device is transferred to another region of the backlight unit.

According to an embodiment, it can be seen that an LED device may be transferred to the backlight unit region of a broader region than an actual region even when the size of a sacrificial substrate is less than the backlight unit. This is one characteristic of an embodiment. Furthermore, when a receiving substrate is the glass substrate of the backlight unit used for the LED display, it may serve as the emitting device of the backlight unit according to the kind of a receiving substrate to which an LED device on the sacrificial substrate is transferred. When the receiving substrate is a substrate receiving the power source of the LED display, it may serve as an internal emitting device that is disposed inside a pixel for realizing all colors by the RGB color combination of an LED device according to the kind of a receiving substrate to which an LED device on the sacrificial substrate is transferred.

The method of manufacturing LED display according to an embodiment may use all arbitrary processes that are used in the related art, and may apply all processes in a case of using a backlight unit to which an LED device has already been transferred and which includes a glass substrate.

Referring to FIGS. 30 and 31, an LED display according to an embodiment includes a backlight unit 600 that includes a PET/glass substrate 601, and a reflector/heat sink layer 602 for reflecting the light of the LED display and removing heat generated. The backlight unit 600 includes an LED device 305 that is manufactured in a sacrificial substrate such as a silicon substrate, is selectively and sequentially separated and is transferred, a phosphor 605 which is included in the LED device 305 and realizes white light, a diffusion plate 621 for sequentially diffusing light, a diffusion film 622, and a prism film 623 stacked on the diffusion film 622. The prism film 623 includes a protection film 624 for physically protecting the LED device.

According to an embodiment, by efficiently transferring respective red, green and blue (RGB) LED devices to the respective pixels of an image display device, an RGB-based full color LED display having a high degree of alignment can be manufactured through the method according to an embodiment. That is, the method according to an embodiment solves limitations that an LED device using a high-temperature process cannot directly implemented in a display substrate such as glass or PET that is easily melted and LED semiconductor materials emitting different lights cannot simultaneously be grown in one substrate, and thus it respectively manufactures the red, green and blue (RGB) LED devices in different sacrificial substrates and thereafter sequentially or simultaneously transfers the LED devices to the image display device.

Figure 33:
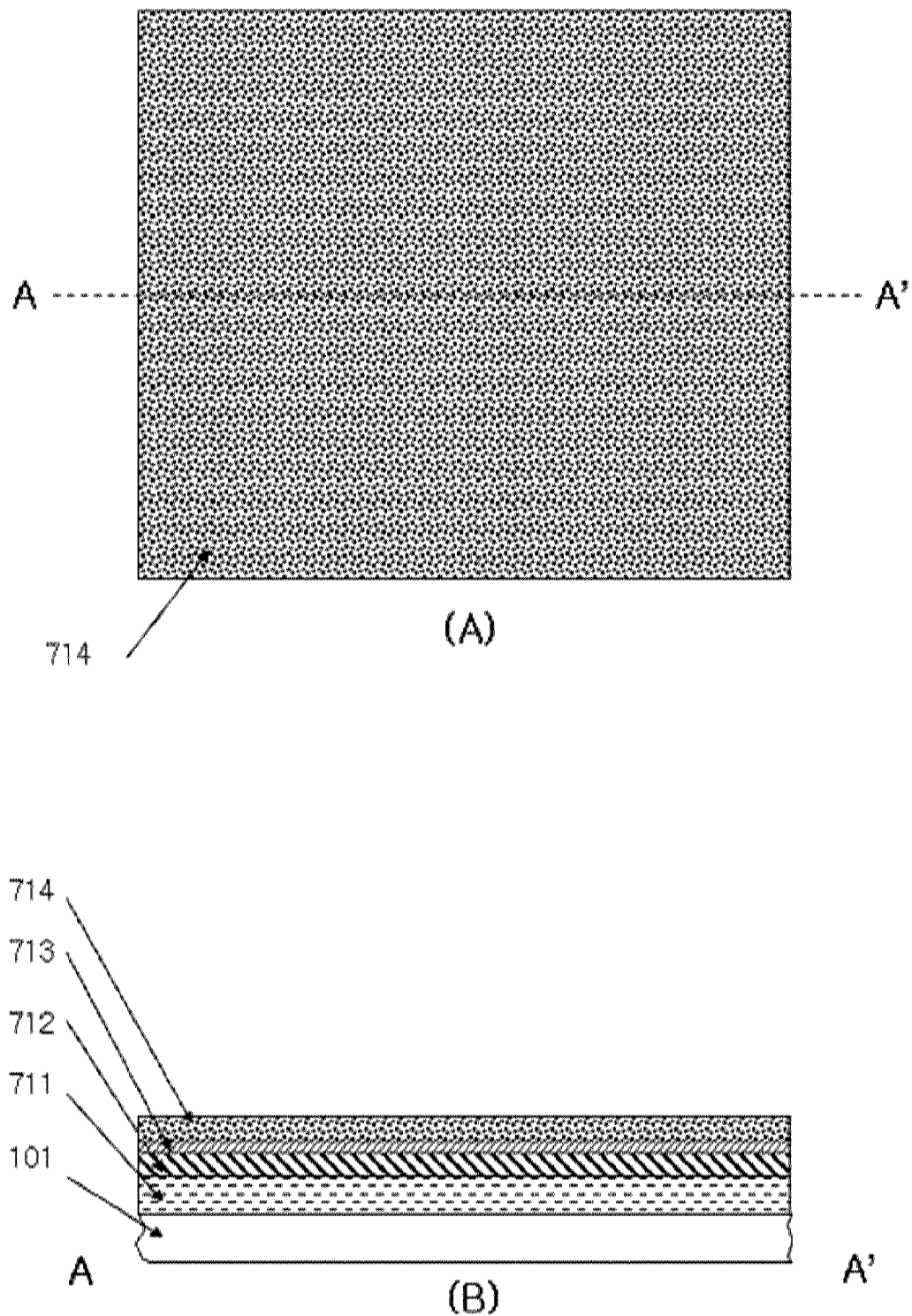

FIGS. 32 to 34 illustrate respective operations for manufacturing a blue LED device on a first sacrificial substrate. A method of manufacturing a blue LED device includes: an operation that provides the LED display substrate 700 of a reflector/heat sink layer 702 and a glass or PET substrate 701 (see FIG. 32), an operation that manufactures a blue LED device layer, i.e., an AlN buffer layer 711, an n-GaN layer 712, a GaN/InGaN layer 713 or a p-GaN layer 714 on a sacrificial substrate (see FIG. 33), and an operation that selectively etches the LED device layer to pattern it into one or more LED devices spaced apart at certain intervals (see FIG. 34). Herein, as illustrated in FIG. 34, the patterned LED device is connected and fixed to an LED device layer, which is not patterned, by a bridge having a narrow width, and thus has an excellent degree of alignment. This is as described above with reference to FIG. 6.

FIG. 35 illustrates a plan view and a cross-sectional view after transferring a blue LED device structure, which is manufactured and patterned on the first sacrificial substrate, to a display device such as glass by using PDMS.

Referring to FIG. 35, it can be seen that one or more blue LED devices are efficiently transferred to a substrate 700 of an LED display such as glass. Particularly, the method according to an embodiment has high efficiency in a large-size display substrate. This is because although LED devices are completed in a relatively narrow sacrificial substrate, the LED devices may be continuously transferred to a broad large-size display substrate, for example, a glass substrate by selectively, continuously and repeatedly separating and transferring the LED devices. An LED display used throughout denotes a device that emits light with LEDs, and may include a device that realizes an image by the combination of at least two or more pixels including three-color RGB LED devices. More specifically, an LED display according to an embodiment may denote its lower substrate, or may be understood as a term that includes a lower substrate including glass or PET, the upper portion of the lower substrate and various function layers (for example, reflector, heat sink layer and PET film) disposed at the lower portion of an LED device. Depending on the case, the an LED display according to an embodiment may denote an image display device that realize an image using only LEDs by controlling the emitting amount of three-color RGB LEDs. This is based on a feature that continuously transfers LED devices on a sacrificial substrate having one feature of an embodiment to a broad large-size display substrate, for example, a glass substrate by continuous and repeated separation/transfer. That is, this is based on a feature that may transfer LED devices at certain intervals manufactured in a narrow-size sacrificial substrate to an LED display in a greater relationship by integer times than the certain intervals.

The separating and transferring process is as described above, and its description will be omitted.

Figure 36:
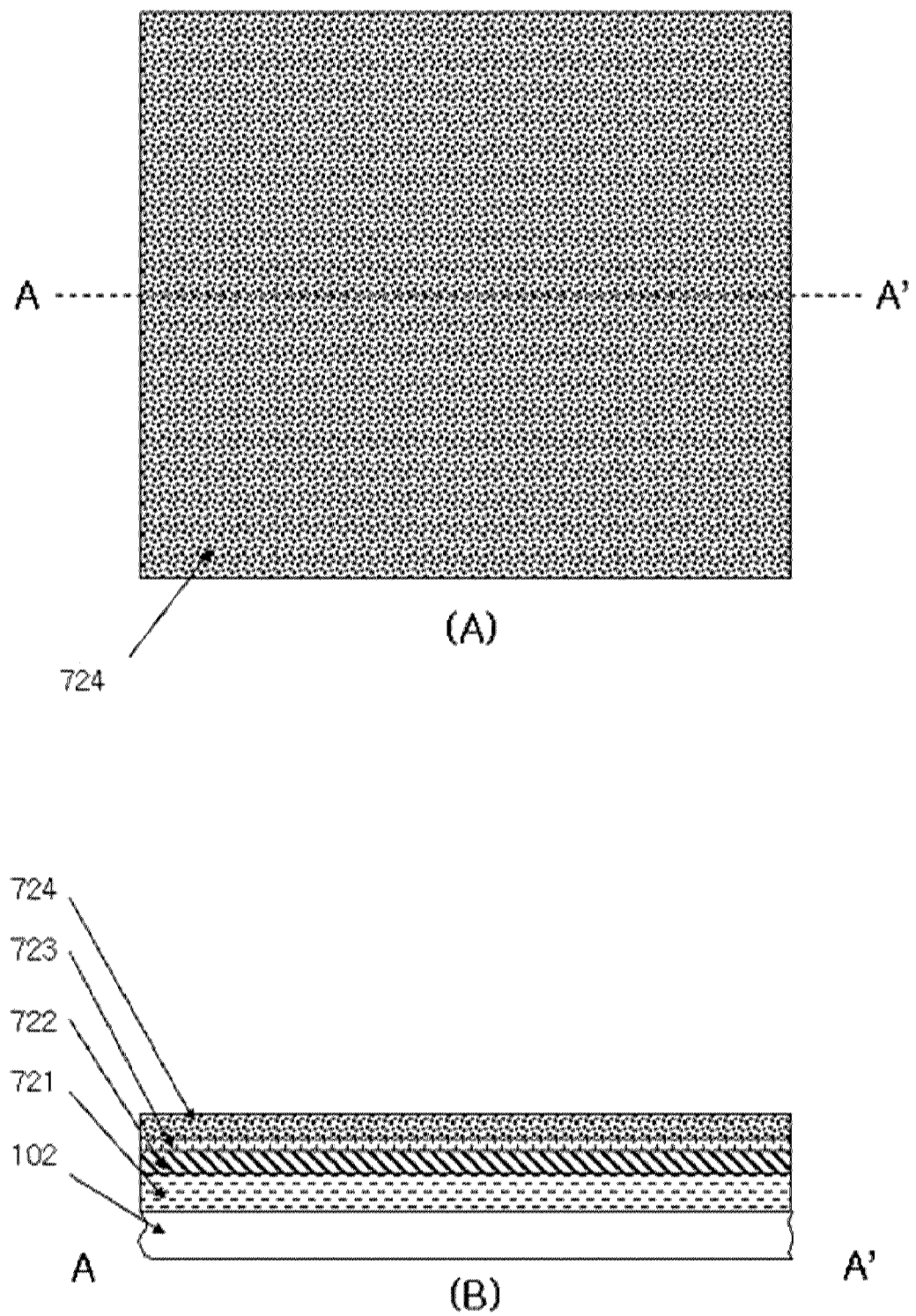

FIGS. 36 and 37 illustrate a process which manufactures a green LED device by stacking and patterning a green LED device layer in a second sacrificial substrate. At this point, a GaN/InGaN layer 723 has a composition ratio different from that of the GaN/InGaN layer 713 of FIGS. 32 to 34 for representing a blue LED, and thus light having a wavelength corresponding to green instead of blue is emitted.

Referring to FIG. 38, the green LED device manufactured on the second sacrificial substrate is transferred to the same glass substrate of FIG. 35. At this point, a green LED device 725 is separated at a distance near to the blue LED device 715 that has already been transferred to a glass substrate and transferred. Particularly, since an LED device according to an embodiment is manufactured in advance on a sacrificial substrate, it has an excellent degree of alignment and may have an accurate LED device arrangement in a unit pixel.

Figure 39:
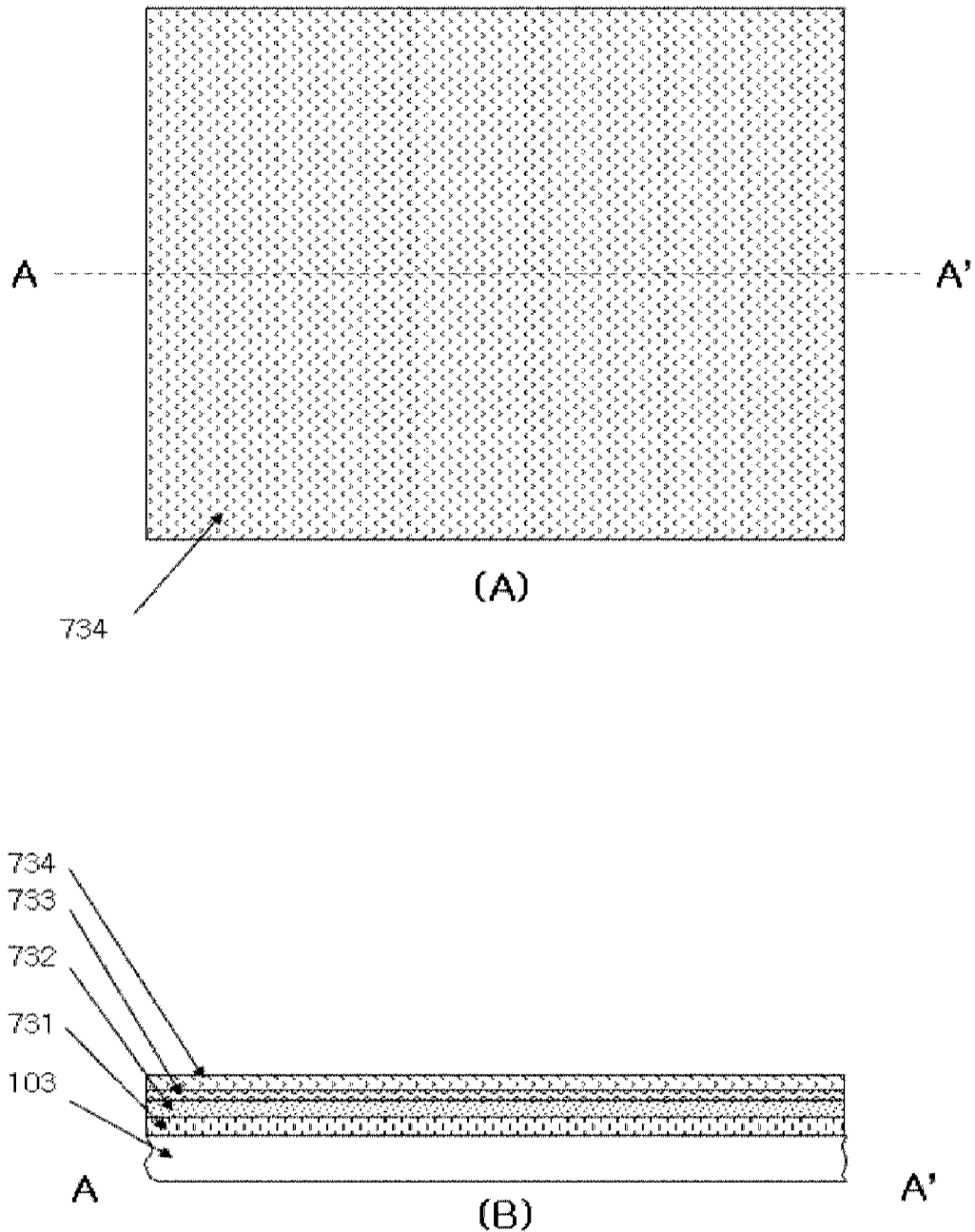

FIGS. 39 to 41 illustrate an operation that transfers a red LED device 735 to the same glass substrate to which the blue and green LED devices have been transferred, and since the operation is the same as the above-described operation, its description will be omitted. However, the materials of a red LED device layer differ from those of the blue and green LED devices, and as illustrated in FIG. 39, the red LED device 735 has the stack structure of n-GaAs 731/n-AlGaInP 732/AlGaInP 733/p-AlGaInP 734.

Referring to FIG. 41, a red LED is transferred to and disposed at a position that is separated by a certain distance from green and blue LEDs on a display substrate 700. Therefore, three-color RGB LEDs are disposed at a high degree of alignment in a unit pixel. That is, the LED devices according to an embodiment are RGB LED devices that include red, green and blue LED devices in a unit pixel region, respectively.

According to another embodiment, the transfer of the red, green and blue LED devices may be sequentially performed in a changed order. Furthermore, all RGB LED devices may be transferred in one-time transfer process, i.e., one-time transfer process by one PDMS. That is, the red, green and blue LED devices are sequentially attached to the same PDMS, and thereafter the RGB LED devices may be transferred to a glass substrate in only one-time transfer process. In this case, considerable economic effect can be obtained. For example, when red, green and blue LED devices are manufactured on respective sacrificial substrates, this corresponds to one LED manufacturing process, and thus much process time can be saved. Subsequently, by sequentially changing a contact point and contacting the same PDMS, RGB devices having the arrangement of FIG. 41 can be realized in PDMS itself. Afterwards, by contacting PDMS to a glass substrate as-is, RGB devices are realized in the glass substrate.

Referring to FIG. 42, a diffusion layer and a diffusion film are stacked on the LED devices of the three primary colors, and thus, based on RGB, an LED display enabling the realization of full colors is manufactured. A diffusion plate 741, a diffusion film 742, a prism film 743 and a protection film 744 may further be stacked.

According to another embodiment, in structure where the LED device is disposed on a receiving substrate, the LED device includes an electrode, and the receiving substrate and/or a member different from it may an interconnection for applying a current to the electrode. In this case, the LED device constitutes a pixel, the receiving substrate directly outputs an image, and thus an LED display may operate as an image display device. At this point, the image display device disposes all RGB LED devices in a space defined as one pixel and discretely controls a current applied to the RGB LED devices, thereby obtaining all colors. According to another embodiment, moreover, an LED device that is manufactured in a small size from about 500 nm to 100 μm may be transferred to an accurate position on the each unit pixel of an LED display used as an image display device.

The LED display and method of manufacturing the same according to embodiments transfer an LED device, which is manufactured on a sacrificial substrate by a high temperature process, to a receiving substrate exemplified as a glass substrate that is provided to a backlight unit (BLU) with a stamping processor exemplified as PolyDiMethylSiloxane (PDMS). Therefore, the limitations of the substrates of LED devices that are manufactured in a related art silicon substrate or sapphire substrate cannot be overcome.

Moreover, blue, red and green (RGB) LED devices that are respectively manufactured in sacrificial substrates are arranged while having a high degree of arrangement with respect to a large-size substrate by respective stamping processors or a single stamping processor, and thus a new LED display enabling the direct realization of full colors can be manufactured. Also, since a manufacturing process for mass production can be applied, the manufacturing costs of LED displays can be largely saved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A method of manufacturing Light Emitting Diode (LED) display, the method comprising:
 (a) forming an LED device layer in a sacrificial substrate;
 (b) etching the LED device layer to manufacture at least two or more LED devices patterned;
 (c) selectively removing the sacrificial substrate in a lower side of the LED device;
 (d) stacking a passivation layer on two or more LED devices to be not removed, which the passivation layer is stacked to the side surface of an LED device requiring no separation, and a part of the passivation layer is formed directly on the sacrificial substrate;

(e) connecting a stamping processor to the LED devices not screened by the passivation layer, disconnecting the stamping processor, and selectively separating the LED device from the sacrificial substrate by performing an anisotropic etching process, wherein in the anisotropic etching process, a part of the sacrificial substrate is removed in a lower side of a LED device of a region on which the passivation layer is not stacked;

(f) transferring the LED device, which is attached to the stamping processor, to a receiving substrate; and (g) removing a part of the passivation layer to selectively separate another LED devices from the sacrificial substrate, and repeating the (e) process at least once;

wherein LED devices at an interval manufactured in the sacrificial substrate is transferred to the LED display in a relationship by integer times than the interval.

2. The method according to claim 1, wherein the stamping processor is PolyDiMethylSiloxane (PDMS).

3. The method according to claim 1, wherein the receiving substrate is a portion of the backlight unit.

4. The method according to claim 3, wherein the backlight unit comprises a glass substrate, and a reflector on the glass substrate.

5. The method according to claim 1, wherein after the transferring of the LED device, the method further comprises stacking a phosphor, a diffusion plate, a diffusion film, a prism film and a protection film on the receiving substrate.

6. The method according to claim 1, wherein a GaN-based semiconductor or a GaAS-based semiconductor is stacked on the LED device layer.

7. The method according to claim 1, wherein among the at least two or more LED devices, at least two or more LED devices are connected.

8. The method according to claim 7, wherein the at least two or more LED devices are connected by the LED device layer.

9. The method according to claim 1, wherein:
among the at least two or more LED devices, at least two or more LED devices are connected by a bridge based on the LED device layer, and
the passivation layer is stacked in at least one portion of the bridge.

10. The method according to claim 1, wherein the selectively removing of the sacrificial substrate, the selectively separating of the LED device and the transferring of the LED device are repeatedly performed until all LED devices are transferred.

11. A method of manufacturing Light Emitting Diode (LED) display, the method comprising:
(a) providing a sacrificial substrate on which RGB LED device layers are formed, respectively;
(b) etching and patterning the LED device layer to manufacture RGB LED devices, respectively;
(c) removing the sacrificial substrate in a lower side of the LED device;
(d) stacking a passivation layer on two or more LED devices to be not removed, which the passivation layer is stacked to the side surface of an LED device requiring no separation, and a part of the passivation layer is formed directly on the sacrificial substrate;
(e) contacting a stamping processor to the RGB LED devices to separate the RGB LED devices not screened by the passivation layer from the sacrificial substrate by performing an anisotropic etching process, wherein in the anisotropic etching process, a part of the sacrificial substrate is removed in a lower side of a LED device of a region on which the passivation layer is not stacked;
(f) transferring the LED device, which is attached to the stamping processor, to a receiving substrate; and
(g) removing a part of the passivation layer to selectively separate another LED devices from the sacrificial substrate, and repeating the (e) process at least once;
wherein LED devices at an interval manufactured in the sacrificial substrate is transferred to the LED display in a relationship by integer times than the interval.

12. The method according to claim 11, wherein the RGB LED devices are transferred to a unit pixel region of the display substrate one by one.

13. The method according to claim 12, wherein in the transferring of the LED device, at least two or more LED devices are transferred in one-time transfer operation.

14. The method according to claim 11, wherein the RGB LED devices are transferred to the display substrate by one stamping processor.

15. The method according to claim 11, wherein the stamping processor is PolyDiMethylSiloxane (PDMS).

* * * * *